US006713886B2

(12) United States Patent
Kumagai et al.

(10) Patent No.: US 6,713,886 B2
(45) Date of Patent: Mar. 30, 2004

(54) SEMICONDUCTOR DEVICE

(75) Inventors: Takashi Kumagai, Chino (JP); Masahiro Takeuchi, Chino (JP); Satoru Kodaira, Chino (JP); Takafumi Noda, Sakata (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 09/827,391

(22) Filed: Apr. 6, 2001

(65) Prior Publication Data

US 2003/0016568 A1 Jan. 23, 2003

(30) Foreign Application Priority Data

Apr. 11, 2000 (JP) ........................................ 2000-109309

(51) Int. Cl.⁷ .............................................. H01L 27/11
(52) U.S. Cl. ...................... 257/903; 257/202; 257/210; 257/211; 257/336; 257/622
(58) Field of Search ................................ 257/202, 210, 257/211, 336, 622

(56) References Cited

U.S. PATENT DOCUMENTS 5,331,191 A * 7/1994 Sugiura et al. ............. 257/336
6,469,400 B2 10/2002 Kumagai et al.

FOREIGN PATENT DOCUMENTS

JP  A 10-41409  2/1998
JP  A 10-178110  6/1998

OTHER PUBLICATIONS

U.S. patent application Ser. No. 09/736,386, Kumagai, filed Dec. 15, 2000.
U.S. patent application Ser. No. 09/758,388, Mori et al., filed Jan. 12, 2001.
U.S. patent application Ser. No. 09/758,390, Mori et al., filed Jan. 12, 2001.
U.S. patent application Ser. No. 09/764,449, Kumagai et al., filed Jan. 19, 2001.
M. Ishida et al., IEDM Technical Digest (1998) p. 203.
SRAM Technologies for Mobile Era (Toshiba Review vol. 56, No. 1, 2001) pp. 42–44.

* cited by examiner

Primary Examiner—David Nelms
Assistant Examiner—Mai-Huong Tran
(74) Attorney, Agent, or Firm—Oliff & Berridge, PLC

(57) ABSTRACT

A semiconductor device includes an SRAM section and a logic circuit section formed on a single semiconductor substrate. First and second gate electrode layers located in a first conductive layer, first and second drain-drain contact layers located in a second conductive layer, first and second drain-gate contact layers located in a third conductive layer become conductive layers for forming a flip-flop of the SRAM section. The logic circuit section has no wiring layer at the same level as the first and second drain-drain contact layers.

9 Claims, 17 Drawing Sheets

SEMICONDUCTOR DEVICE

Japanese patent application no. 2000-109309, filed Apr. 11, 2000, is hereby incorporated by reference in its entirety.

Technical Field

The present invention relates to a semiconductor device including a memory cell section such as an SRAM (Static Random Access Memory).

Background

An SRAM does not need refreshing. Therefore, the SRAM enables system configuration to be simplified and consumes only a small amount of electric power. Because of this, the SRAM is suitably used as a memory for portable devices such as portable telephones. There has been a demand for miniaturization of portable devices on which the SRAM is mounted. To deal with this demand, the memory cell size of the SRAM must be reduced.

Summary

An objective of certain embodiments of the present invention is to provide a semiconductor device capable of reducing memory cell size.

A semiconductor device according to one embodiment of the present invention comprises a memory cell section and a semiconductor circuit section other than the memory cell section that are formed on the same semiconductor substrate, the memory cell section having a plurality of memory cells each of which includes a first driver transistor, a second driver transistor, a first load transistor, a second load transistor, a first transfer transistor, and a second transfer transistor, wherein:

each of the memory cells comprises a first gate electrode layer, a second gate electrode layer, a first drain-drain contact layer, a second drain-drain contact layer, a first drain-gate contact layer, and a second drain-gate contact layer;

the first gate electrode layer comprises a gate electrode of the first driver transistor and a gate electrode of the first load transistor;

the second gate electrode layer comprises a gate electrode of the second driver transistor and a gate electrode of the second load transistor;

the first drain-drain contact layer and the second drain-drain contact layer are located above the first gate electrode layer and the second gate electrode layer;

the first gate electrode layer and the second gate electrode layer are located between the first drain-drain contact layer and the second drain-drain contact layer, as seen in a plan view of the memory cells;

the first drain-drain contact layer is used to connect a drain region of the first driver transistor to a drain region of the first load transistor;

the second drain-drain contact layer is used to connect a drain region of the second driver transistor to a drain region of the second load transistor;

the first drain-gate contact layer and the second drain-gate contact layer are located above the first drain-drain contact layer and the second drain-drain contact layer;

the first drain-gate contact layer is used to connect the first drain-drain contact layer to the second gate electrode layer;

the second drain-gate contact layer is used to connect the second drain-drain contact layer to the first gate electrode layer; and the semiconductor circuit section has no wiring layer at the same level as the first drain-drain contact layer and the second drain-drain contact layer.

The semiconductor device of another embodiment of the present invention includes the gate electrode layers which become gates of inverters, the drain-drain contact layers for connecting drains of the inverters, and the drain-gate contact layers for connecting the gate of one inverter to the drain of the other inverter. In this semiconductor device, a flip-flop is formed using three layers (gate electrode layer, drain-drain contact layer, and drain-gate contact layer). Therefore, the pattern of each layer can be simplified (linear pattern, for example) in comparison with the case of forming a flip-flop using two layers. According to this embodiment of the present invention, since the pattern of each layer can be simplified, a miniaturized semiconductor device with a memory cell size of 4.5 $\mu m^2$ or less can be fabricated.

The first gate electrode layer and the second gate electrode layer are located between the first drain-drain contact layer and the second drain-drain contact layer in a plan view. Therefore, a source contact layer of the driver transistors can be disposed at the center of the memory cell. Moreover, a wiring layer formed in the same layer as the drain-drain contact layer to which the source contact layer is connected can be disposed at the center of the memory cell. Therefore, the degree of freedom relating to formation of the first and second drain-gate contact layers can be increased. This also ensures reduction of the memory cell size. The source contact layer is a conductive layer used to connect the source region of the driver transistor to the wiring layer.

Another embodiment of the present invention may increase the speed of the semiconductor circuit section with miniaturized memory cells embedded. Specifically, another embodiment of the present invention may use a refractory metal nitride layer as the first and second drain-drain contact layers, as described later. A refractory metal nitride layer exhibits relatively high electric resistance. Therefore, when a refractory metal nitride layer is used as the wiring layer in the semiconductor circuit section, the speed of the semiconductor circuit section cannot be increased. Since the semiconductor circuit section does not have a wiring layer at the same level as the first and second drain-drain contact layers, the speed of the semiconductor circuit section can be increased.

A thickness of the first drain-drain contact layer and the second drain-drain contact layer may be 100 nm to 170 nm. This is because the first and second drain-drain contact layers with a thickness of 100 nm or more exhibit suitable electric resistance values. When the thickness of the first and second drain-drain contact layers is 170 nm or less, the thickness of an interlayer dielectric located on the first and second drain-drain contact layers does not become too great. This ensures that the aspect ratio of hole section (through-hole, for example) formed in the interlayer dielectric is decreased (5 or less, for example). The thickness of the first and second drain-drain contact layers may be adjusted to 170 nm or less by allowing a refractory metal nitride layer such as titanium nitride to be included in the first and second drain-drain contact layers.

The semiconductor device of another embodiment of the present invention may further comprise a field effect transistor, a first interlayer dielectric, a second interlayer dielectric, a wiring layer, and a contact-conductive section, wherein:

the field effect transistor may be located in the semiconductor circuit section;

the first interlayer dielectric may be located in the memory cell section so as to cover the first gate electrode layer and the second gate electrode layer;

the first interlayer dielectric may be located in the semiconductor circuit section so as to cover a gate electrode of the field effect transistor;

the second interlayer dielectric may be formed in the memory cell section so as to cover the first drain-drain contact layer and the second drain-drain contact layer;

the second interlayer dielectric may be located on the first interlayer dielectric in the semiconductor circuit section;

the wiring layer may be located on the second interlayer dielectric in the semiconductor circuit section;

the wiring layer may be located at the same level as the first drain-gate contact layer and the second drain-gate contact layer;

the contact-conductive section may be located in a hole section formed through the first interlayer dielectric and the second interlayer dielectric in the semiconductor circuit section; and the contact-conductive section may be used to connect the wiring layer to at least one of a source/drain of the field effect transistor and a gate electrode of the field effect transistor.

The wiring layer may be connected to the source/drain and the gate electrode of the field effect transistor using the contact-conductive section without forming a contact pad layer between the first interlayer dielectric and the second interlayer dielectric. Therefore, the fabrication process of the semiconductor circuit section can be simplified.

The aspect ratio of the hole section may be 5 or less. The hole section with an aspect ratio of 5 or less can be easily filled with the contact-conductive section.

The semiconductor circuit section may comprise a logic circuit section. This is because higher speed is required for the logic circuit section. For example, the logic circuit section includes a gate array, standard cell, and system LSI.

The first gate electrode layer, the second gate electrode layer, the first drain-drain contact layer, and the second drain-drain contact layer respectively may have a linear pattern and may be disposed in parallel one another. Since the pattern of each layer is simple, a semiconductor device with a minute memory cell size can be fabricated.

With the semiconductor device of another embodiment of the present invention, the first driver transistor and the second driver transistor may be n-type;

the first load transistor and the second load transistor may be p-type;

the first transfer transistor and the second transfer transistor may be n-type;

the memory cell section may comprise a first conductive layer, a second conductive layer, a third conductive layer, and a fourth conductive layer;

the first gate electrode layer, the second gate electrode layer, and a sub-word line may be located in the first conductive layer;

the first drain-drain contact layer, the second drain-drain contact layer, a power supply line, a first contact pad layer, a second contact pad layer, and a third contact pad layer may be located in the second conductive layer;

the first drain-gate contact layer, the second drain-gate contact layer, a main-word line, a fourth contact pad layer, a fifth contact pad layer, and a sixth contact pad layer may be located in the third conductive layer;

a first bit line, a second bit line, and a ground line may be located in the fourth conductive layer;

the sub-word line may extend in a first direction;

the power supply line may be connected to a source region of the first load transistor and the second load transistor;

the first contact pad layer may be used to connect the first bit line to a source/drain region of the first transfer transistor;

the second contact pad layer may be used to connect the second bit line to a source/drain region of the second transfer transistor;

the third contact pad layer may be used to connect a source region of the first driver transistor and the second driver transistor to the ground line;

the main-word line may extend in the first direction;

the fourth contact pad layer may be used to connect the first bit line to a source/drain region of the first transfer transistor;

the fifth contact pad layer may be used to connect the second bit line to a source/drain region of the second transfer transistor;

the sixth contact pad layer may be used to connect a source region of the first driver transistor and the second driver transistor to the ground line; and the first bit line and the second bit line may extend in a second direction which intersects the first direction at right angles.

According to another embodiment of the present invention, various performances (miniaturization, reliability, stability, and speed, for example) required for semiconductor devices can be increased while balancing these performances.

DETAILED DESCRIPTION

Figure 18:
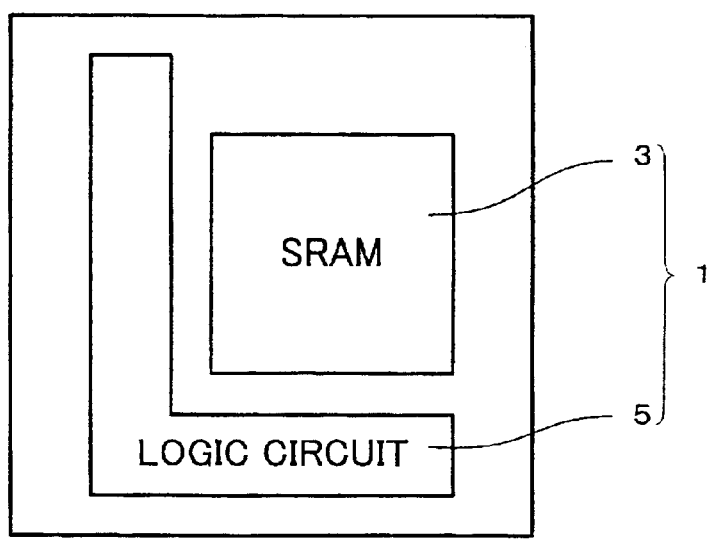
FIG. 18 is a plan view showing a semiconductor device according to the embodiment of the present invention.

An embodiment of the semiconductor device according to the present invention will be described below. FIG. 18 is a plan view showing a semiconductor device 1 of the present embodiment. In the semiconductor device 1 of the present embodiment, an SRAM section 3 and a logic circuit section 5 are formed on a single semiconductor substrate. Such a semiconductor device is generally called an embedded memory chip. The outline of the structure of the SRAM section 3, the details of the structure of the SRAM section 3, the structure of the logic circuit section 5, and the major effects of the present embodiment will be described in that order.

1. Outline of Structure of SRAM Section 3

The SRAM section 3 of the present embodiment is a type of memory in which one memory cell is formed by six MOS field effect transistors. The outline of the structure of the SRAM section 3 is described below by separately describing the structure of a section which forms a flip-flop of the memory cell and the structure of the memory cell.

Structure of Section Which Forms Flip-Flop of Memory Cell

Figure 1:
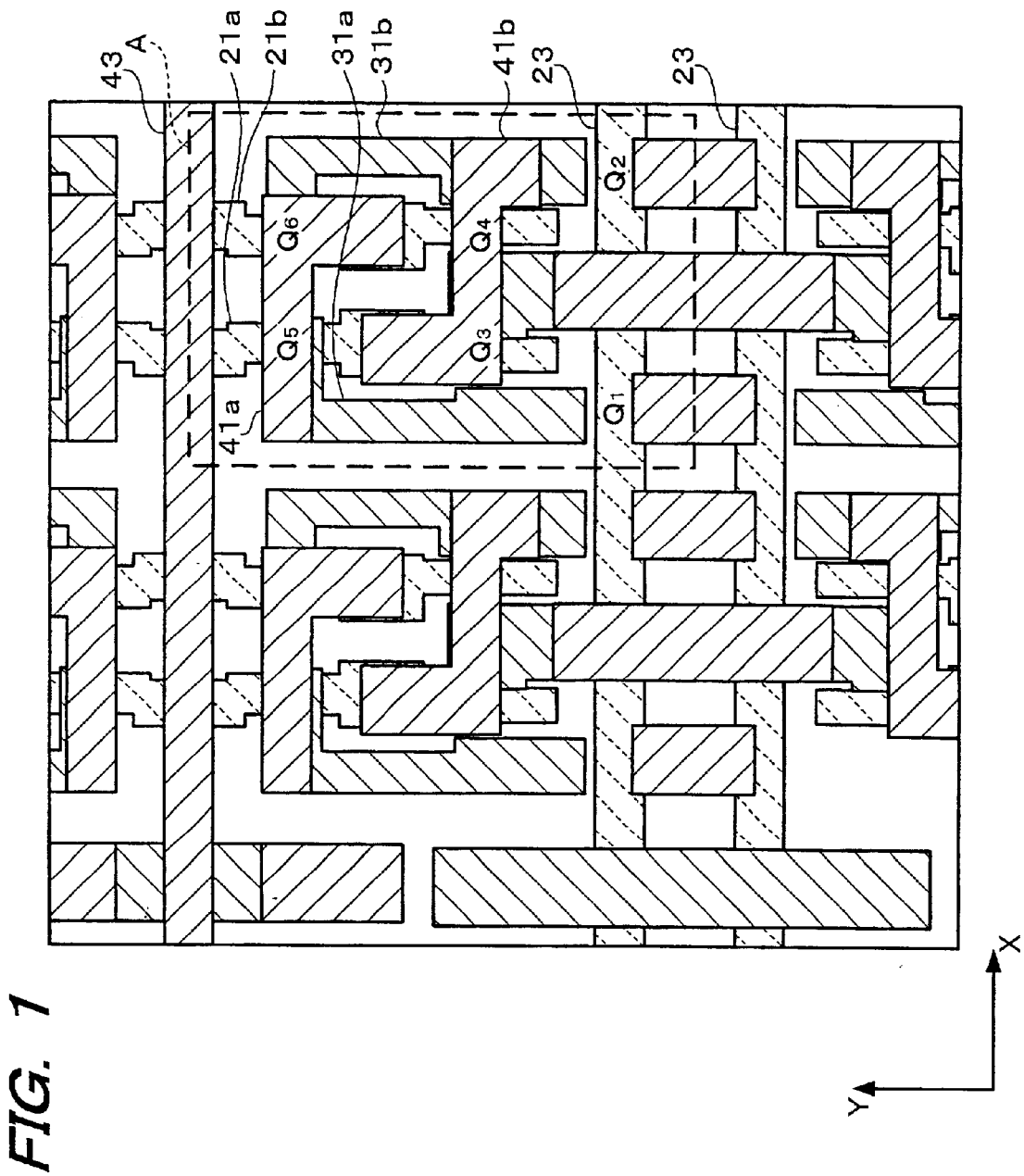
FIG. 1 is a plan view showing a first conductive layer, a second conductive layer, and a third conductive layer in part of a memory cell array of an SRAM section according to an embodiment of the present invention.

FIG. 1 is a plan view showing a first conductive layer, a second conductive layer, and a third conductive layer in part of the memory cell array of the SRAM section 3 of the present embodiment. The first conductive layer, the second conductive layer, and the third conductive layer are individually described to ensure that FIG. 1 is readily understood.

Figure 3:
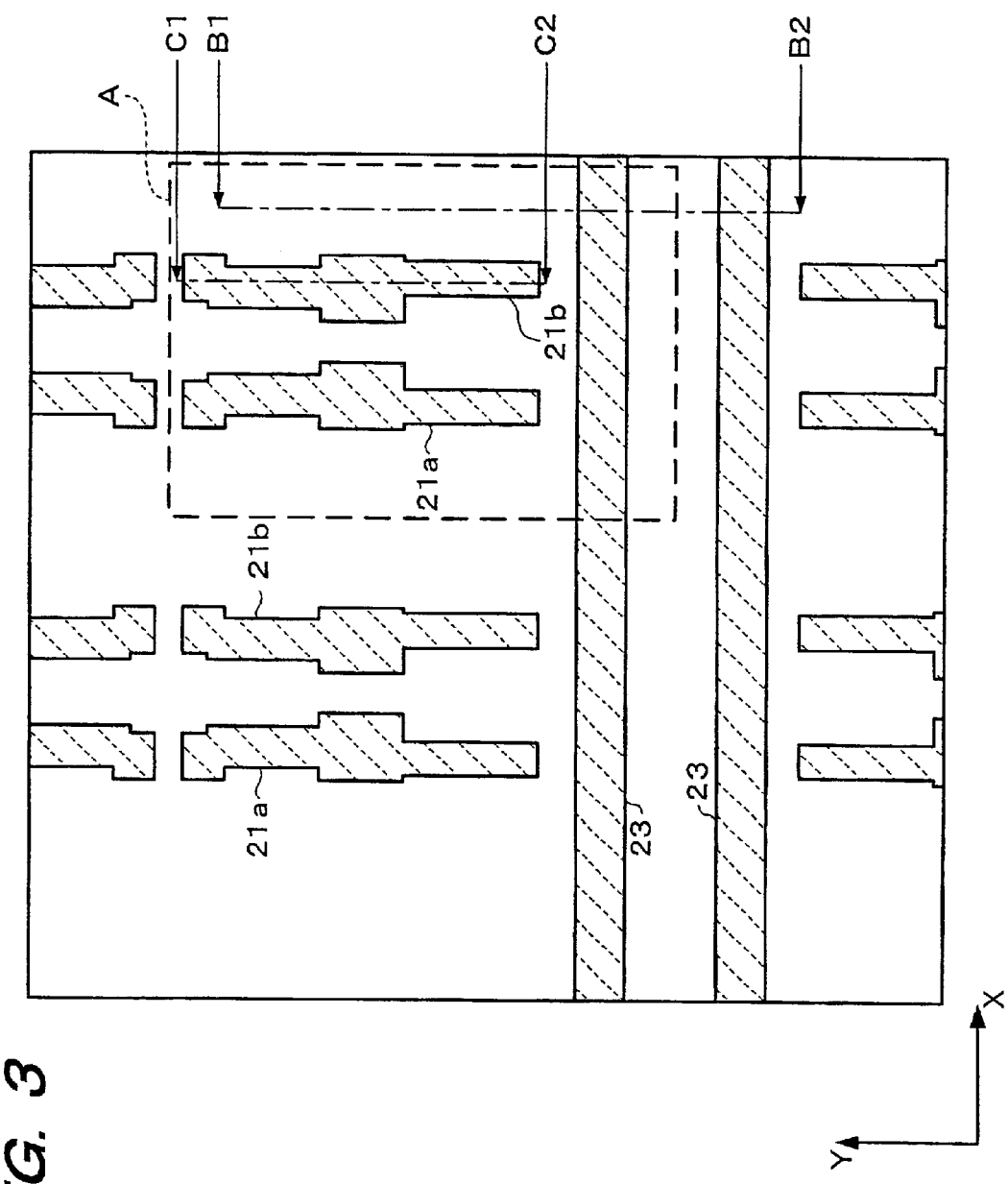
FIG. 3 is a plan view showing the first conductive layer in part of the memory cell array of the SRAM section according to the embodiment of the present invention.
Figure 5:
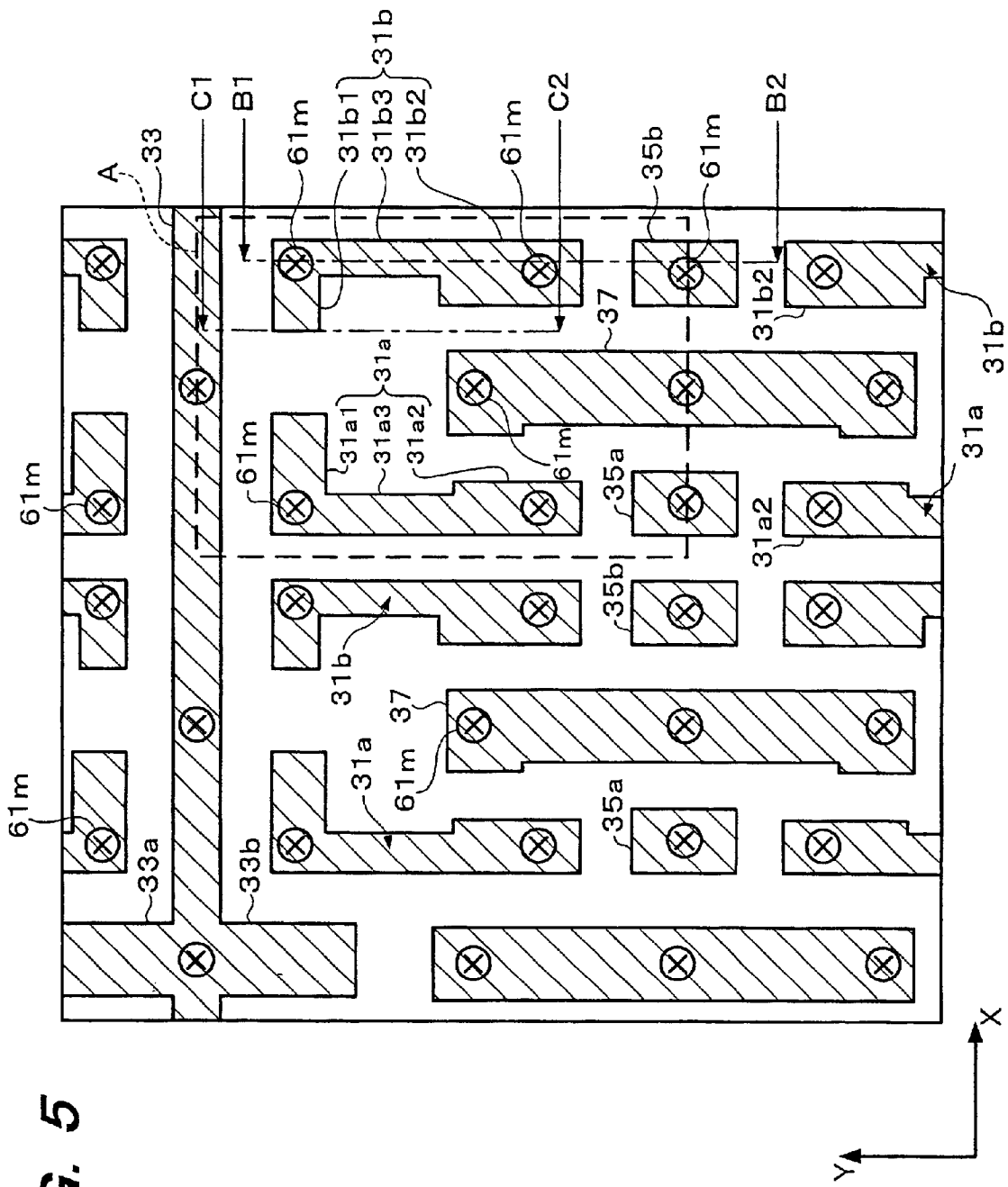
FIG. 5 is a plan view showing the second conductive layer in part of the memory cell array of the SRAM section according to the embodiment of the present invention.
Figure 8:
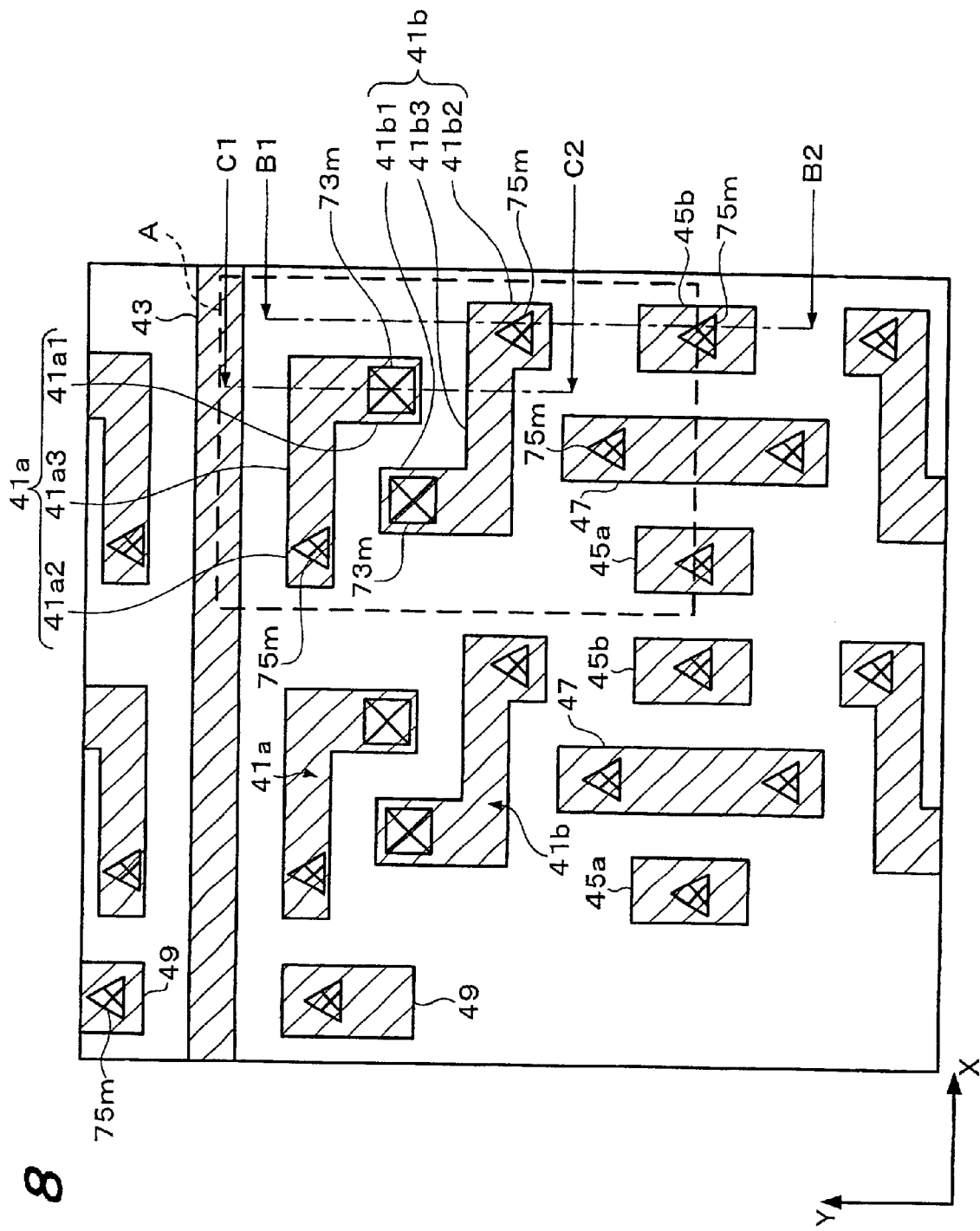
FIG. 8 is a plan view showing the third conductive layer in part of the memory cell array of the SRAM section according to the embodiment of the present invention.

Gate electrode layers 21a and 21b and sub-word lines 23 are disposed in the first conductive layer, as shown in FIG. 3. Drain-drain contact layers 31a and 31b and the like are disposed in the second conductive layer, as shown in FIG. 5. Drain-gate contact layers 41a and 41b and the like are disposed in the third conductive layer, as shown in FIG. 8. The structure shown in FIG. 5 is positioned on the structure shown in FIG. 3, and the structure shown in FIG. 8 is positioned on the structure shown in FIG. 5. FIG. 1 shows these structures collectively.

FIG. 1 shows a section which forms a flip-flop. This section is described below focusing on a region A. One memory cell is formed in the region A. The region A shown in other Figs. has the same meaning.

Figure 17:
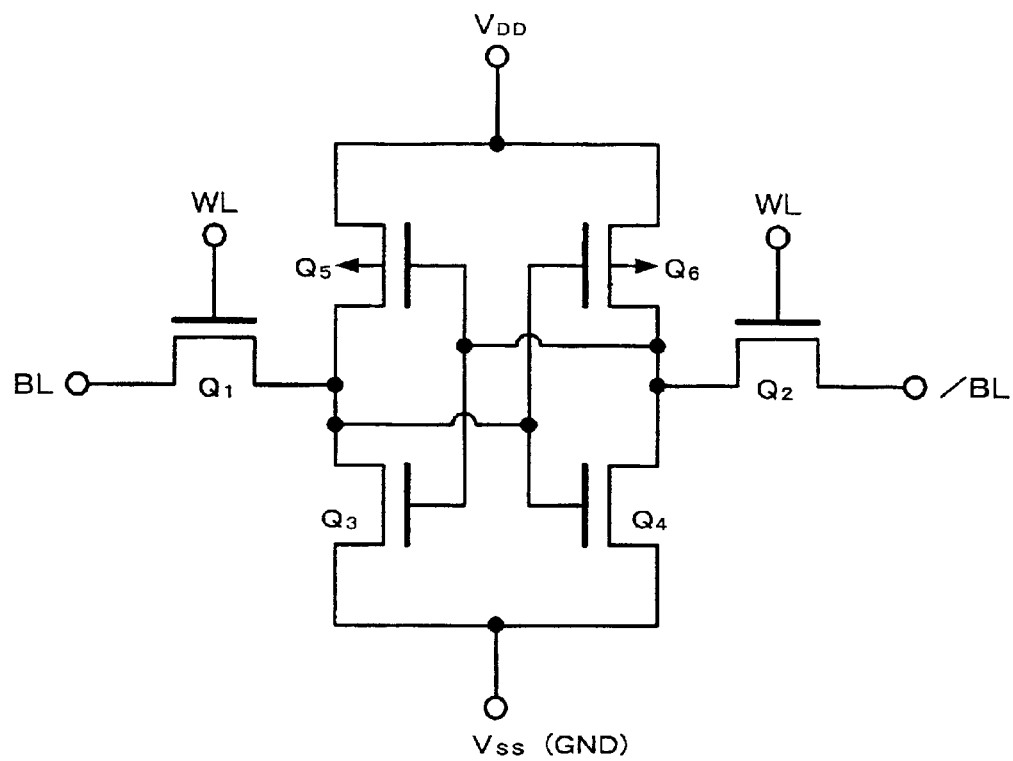
FIG. 17 shows an equivalent circuit of the SRAM according to the embodiment of the present invention.

In the region A, six MOS field effect transistors including n-channel transfer transistors $Q_1$ and $Q_2$, n-channel driver transistors $Q_3$ and $Q_4$, and p-channel load transistors $Q_5$ and $Q_6$ are formed. The driver transistor $Q_3$ and the load transistor $Q_5$ form one CMOS inverter. The driver transistor $Q_4$ and the load transistor $Q_6$ form one CMOS inverter. A flip-flop is formed by cross-coupling these two CMOS inverters. FIG. 17 shows an equivalent circuit of the circuit formed by the six MOS field effect transistors in the region A.

The gate electrode layer 21a and the gate electrode layer 21b respectively have a linear pattern, as shown in FIG. 1. The gate electrode layer 21a forms gate electrodes of the driver transistor $Q_3$ and the load transistor $Q_5$ and connects these gate electrodes. The gate electrode layer 21b forms gate electrodes of the driver transistor $Q_4$ and the load transistor Q6 and connects these gate electrodes.

A drain region of the driver transistor $Q_3$ and a drain region of the load transistor $Q_5$ are connected by the drain-drain contact layer 31a. A drain region of the driver transistor $Q_4$ and a drain region of the load transistor $Q_6$ are connected by the drain-drain contact layer 31b. The drain-drain contact layer 31a and the drain-drain contact layer 31b have a linear pattern.

The gate electrode (gate electrode layer 21a) of the driver transistor $Q_3$ and the load transistor $Q_5$ and the drain-drain contact layer 31b are connected by the drain-gate contact layer 41b. The gate electrode (gate electrode layer 21b) of the driver transistor $Q_4$ and the load transistor $Q_6$ and the drain-drain contact layer 31a are connected by the drain-gate contact layer 41a. The drain-gate contact layer 41a and the drain-gate contact layer 41b respectively have a pattern in the shape of the letter "L". The angle formed by the first side and the second side of the L-shaped pattern is approximately 90°. The first side of the drain-gate contact layer 41a faces the first side of the drain-gate contact layer 41b. The second side of the drain-gate contact layer 41a faces the second side of the drain-gate contact layer 41b. The drain-gate contact layer 41a and the drain-gate contact layer 41b are approximately point-symmetrical.

The gate electrode layer 21a, the gate electrode layer 21b, the drain-drain contact layer 31a, and the drain-drain contact layer 31b are disposed in parallel. In a plan view, the gate electrode layers 21a and 21b are located between the drain-drain contact layer 31a and the drain-drain contact layer 31b.

Structure of Memory Cell

Figure 2:
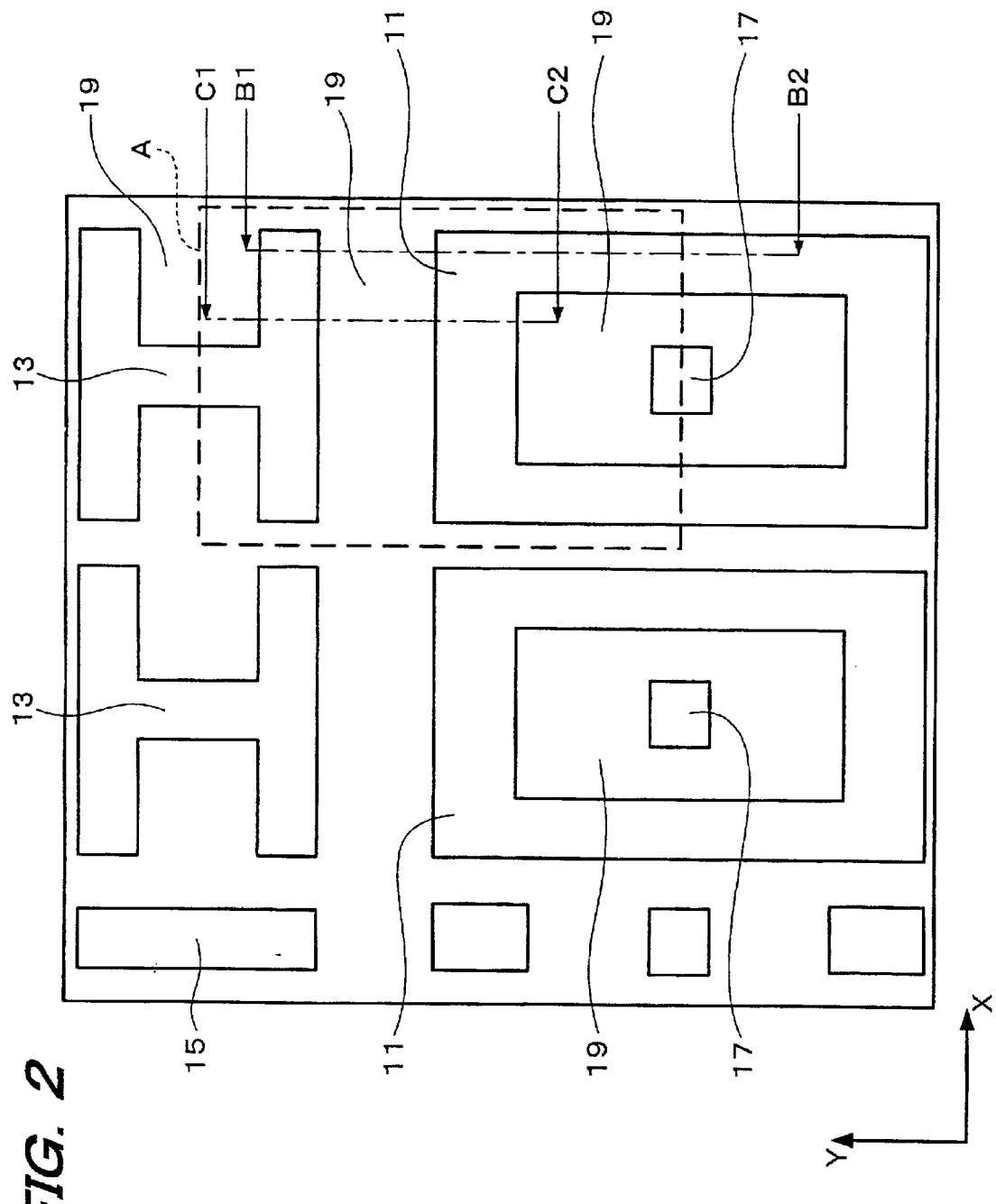
FIG. 2 is a plan view showing a field in part of the memory cell array of the SRAM section according to the embodiment of the present invention.
Figure 10:
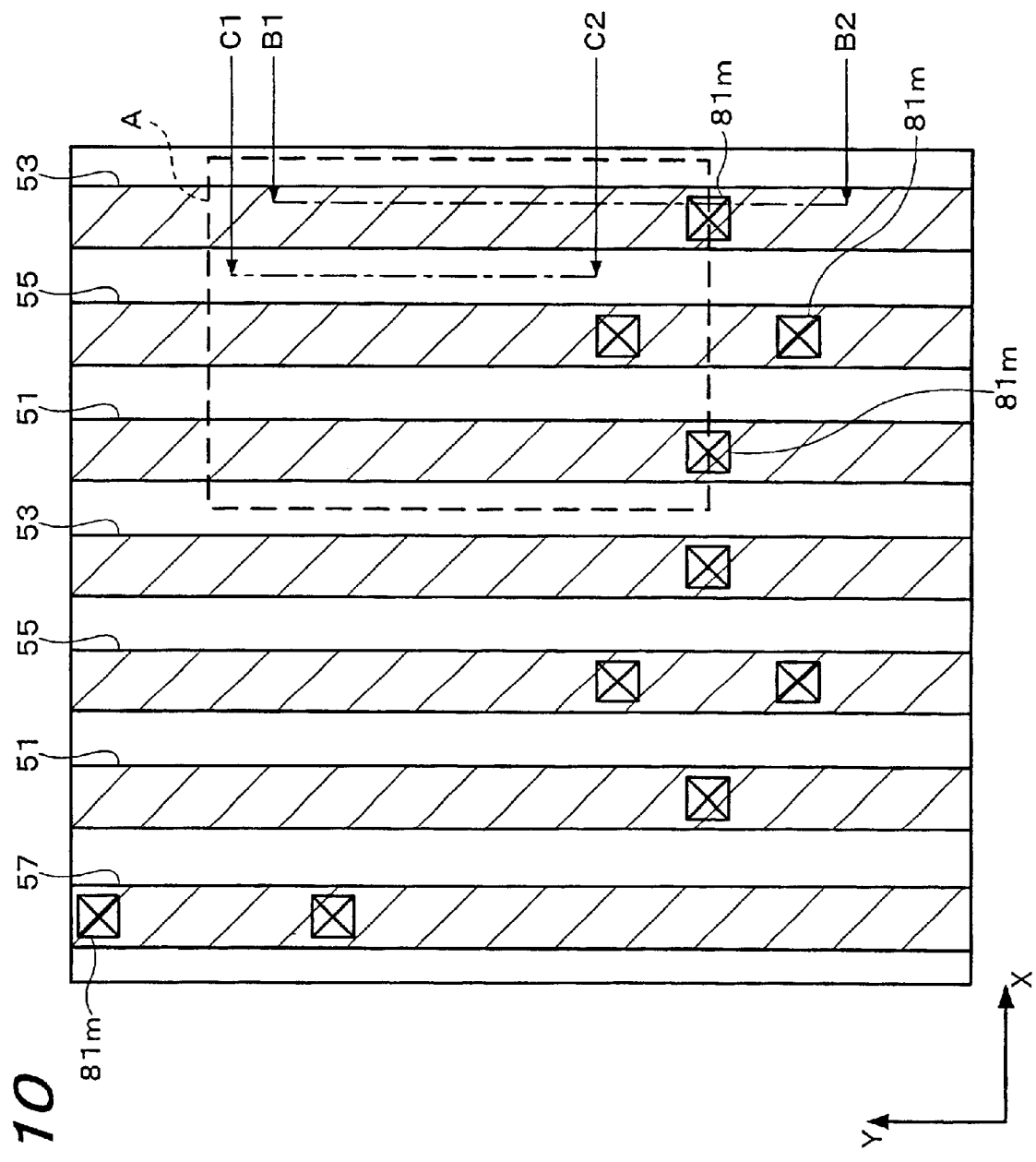
FIG. 10 is a plan view showing the fourth conductive layer in part of the memory cell array of the SRAM section according to the embodiment of the present invention.

The memory cell structure of the SRAM section 3 of the present embodiment is described below. The memory cell of the SRAM section 3 has a structure in which the first conductive layer, the second conductive layer, the third conductive layer, and the fourth conductive layer are laminated on a field through interlayer dielectrics. The field is a region in which active regions 11, 13, 15, and 17 and element isolation regions 19 are located, as shown in FIG. 2. Bit lines 51 and the like are formed in the fourth conductive layer, as shown in FIG. 10. The memory cell of the SRAM section 3 has a structure in which the first conductive layer, the second conductive layer, and the third conductive layer shown in FIG. 1 are located on the field shown in FIG. 2. The fourth conductive layer shown in FIG. 10 is located above the third conductive layer.

2. Details of Structure of SRAM Section 3

Figure 13:
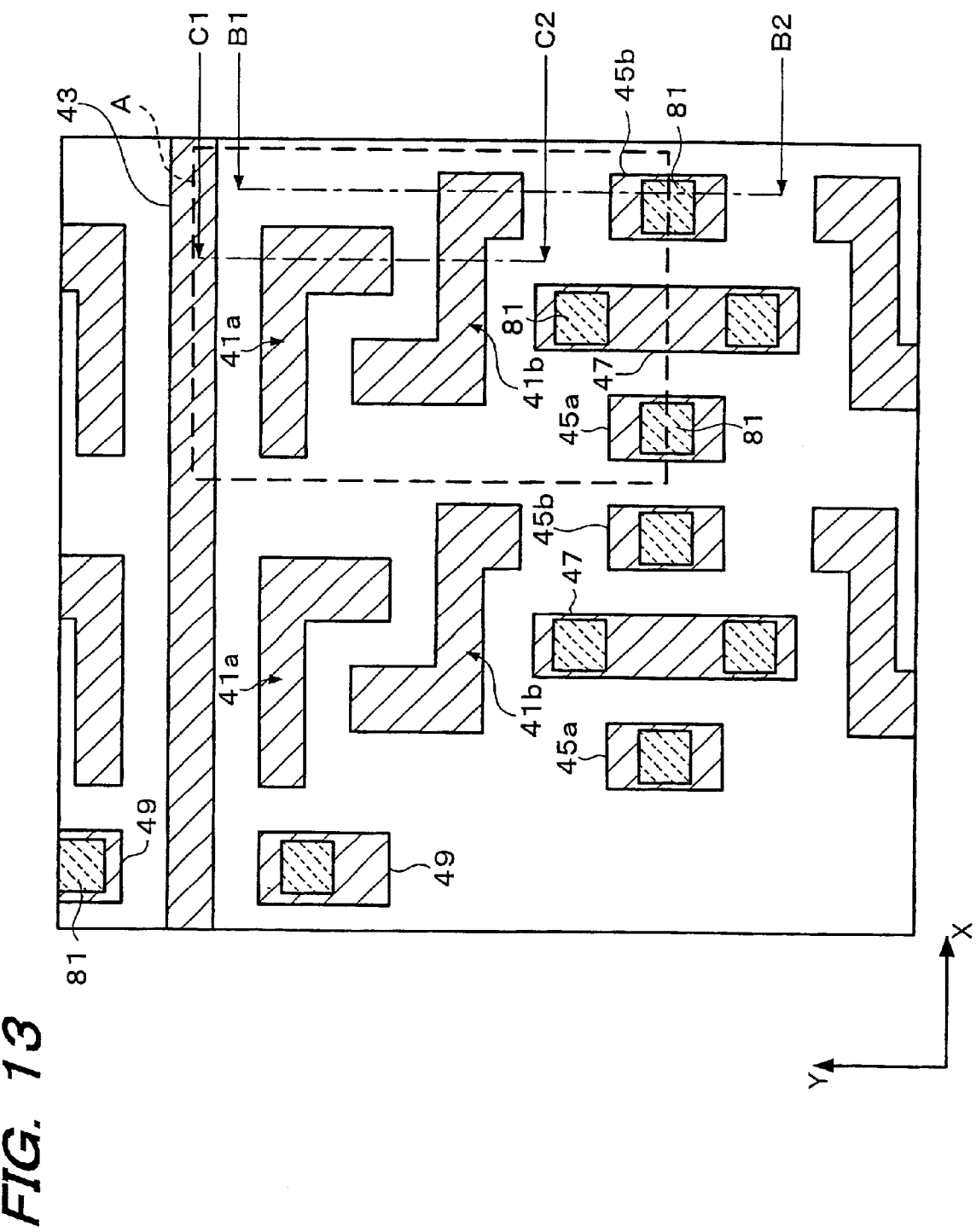
FIG. 13 is a plan view showing the third conductive layer and the contact-conductive section 81 in the SRAM section according to the embodiment of the present invention.
Figure 14:
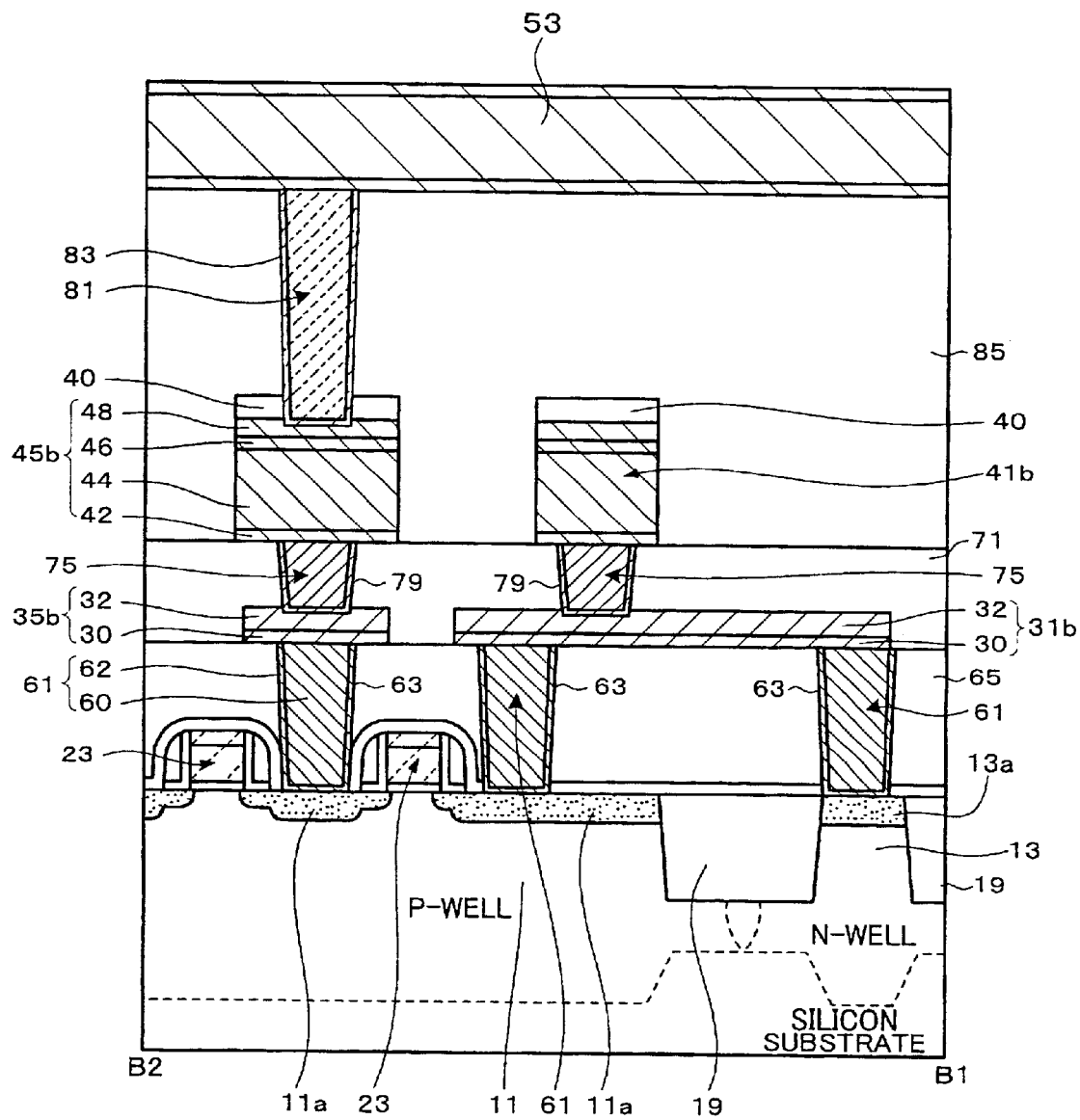
FIG. 14 is a cross-sectional view of the SRAM section according to the embodiment of the present invention along the line B1–B2.
Figure 15:
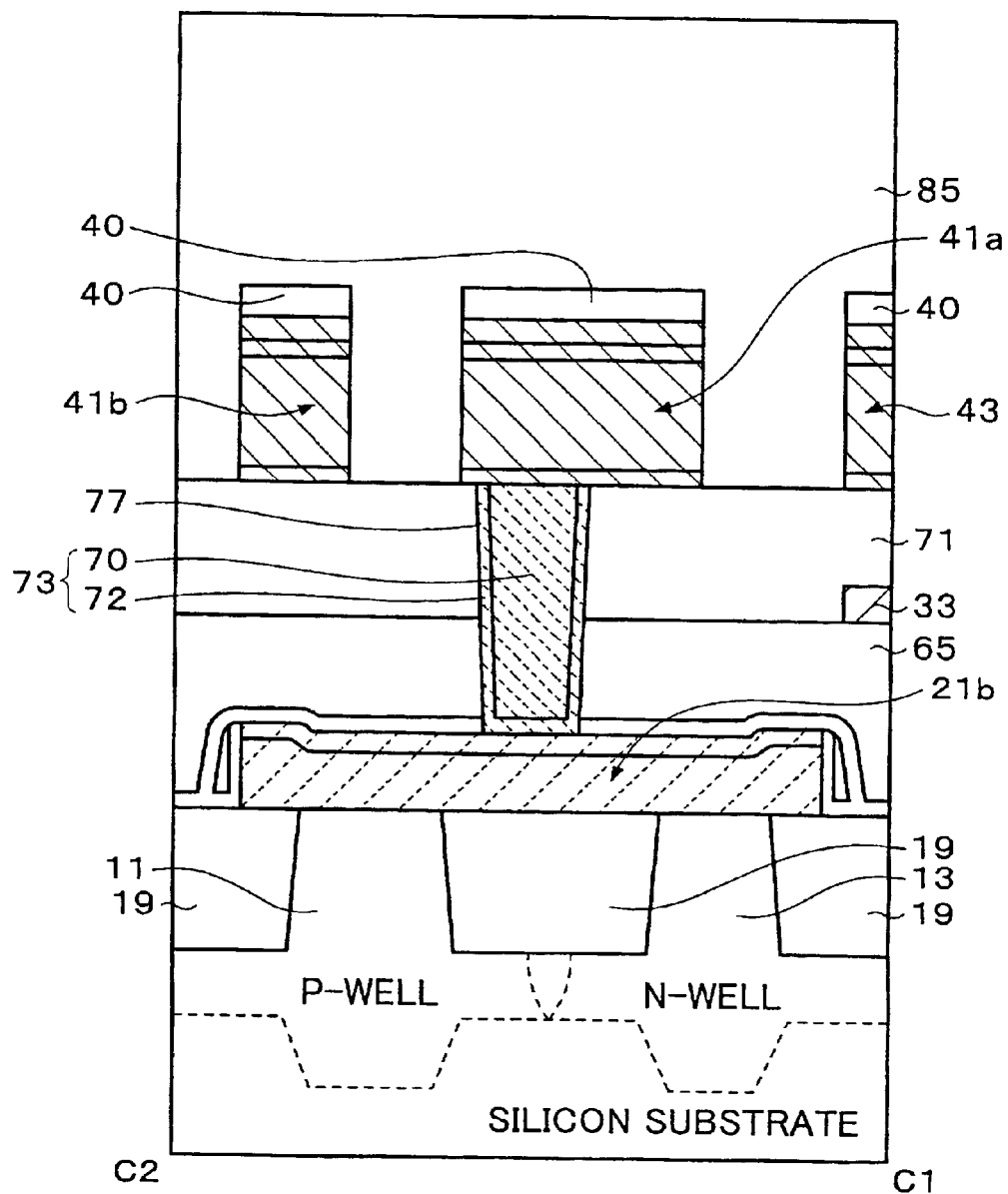
FIG. 15 is a cross-sectional view of the SRAM section according to the embodiment of the present invention along the line C1–C2.

The details of the structure of the SRAM section 3 are described below with reference to FIGS. 2 to 15 in the order from the lower layers. Note that a line B1–B2 and a line C1–C2 are drawn in FIGS. 2 to 13. FIG. 14 is a view showing the cross section along the line B1–B2. FIG. 15 is a view showing the cross-section along the line C1–C2.

Field and First Conductive Layer

Figure 11:
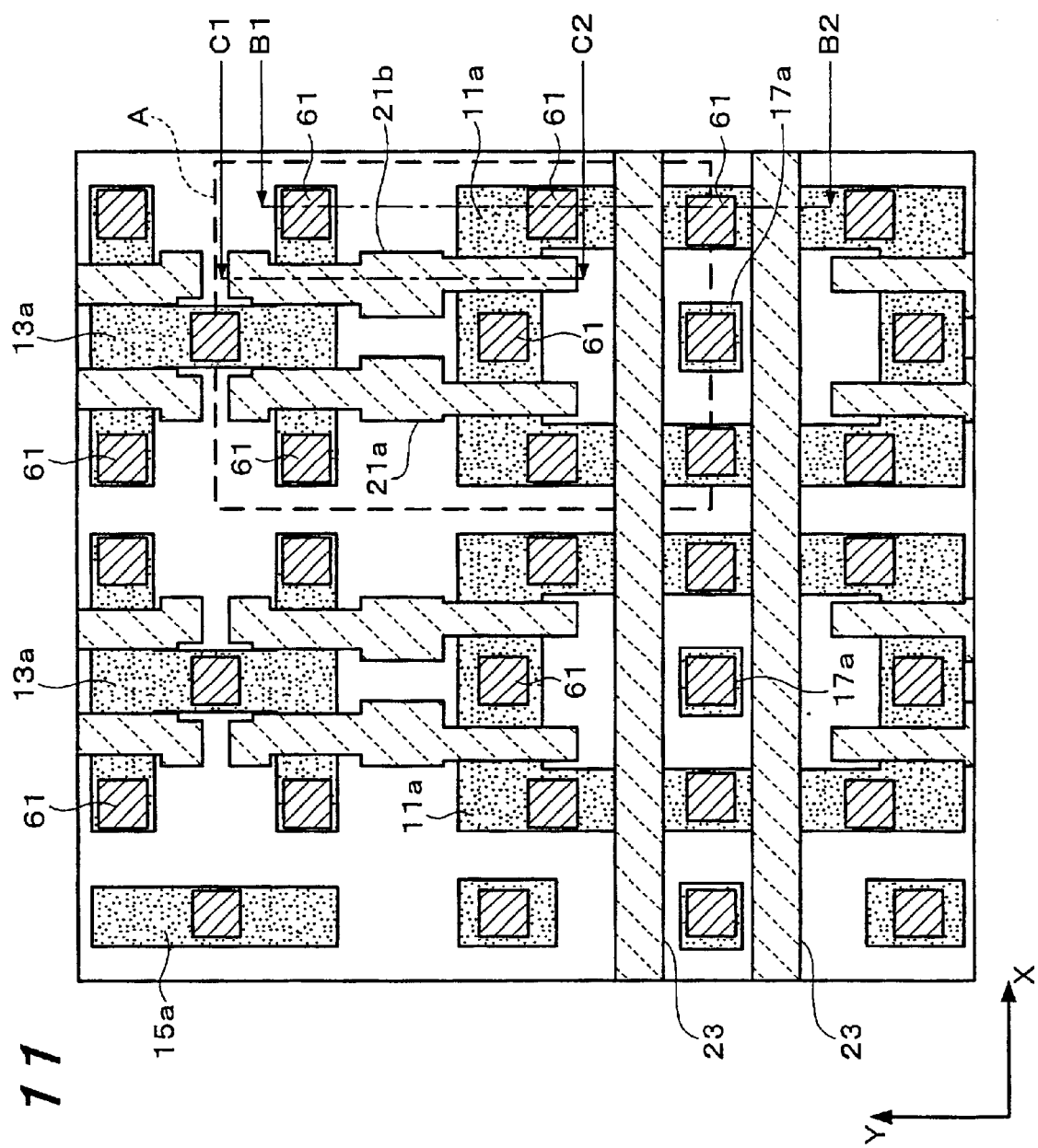
FIG. 11 is a plan view showing the field, first conductive layer, and contact-conductive section 61 in the SRAM section according to the embodiment of the present invention.

FIG. 11 is a plan view showing the field and the first conductive layer. First, the field is described with reference to FIGS. 2, 14, and 15. FIG. 2 is a plan view showing the field. The field includes the active regions 11, 13, 15, and 17 and the element isolation regions 19. The active regions 11, 13, 15, and 17 are formed on the surface of a silicon substrate.

The active regions 11 has a substantially rectangular shape with a rectangular opening formed therein. In FIG. 2, a plurality of the active regions 11 is arrayed in the X-axial direction. The transfer transistors $Q_1$ and $Q_2$ and the driver transistors $Q_3$ and $Q_4$ shown in FIG. 1 are formed in the active regions 11.

The active regions 13 is substantially H-shaped. In FIG. 2, a plurality of the active regions 13 is arrayed in the X-axial direction. The load transistors $Q_5$ and $Q_6$ shown in FIG. 1 are formed in the active regions 13.

The active regions 15 are formed in every 32 memory cells arrayed in the X-axial direction, for example. A well contact region of an n-well is formed in the active region 15. An n-well corresponding to 32 memory cells is connected to a $V_{DD}$ line (power supply line) through the well contact region.

The active regions 17 are formed in every two memory cells arrayed in the Y-axial direction. A well contact region of a p-well is formed in the active region 17. A p-well corresponding to two memory cells is connected to a $V_{ss}$ line (ground line) through the well contact region.

The active regions 11, 13, 15, and 17 are isolated from one another by the element isolation regions 19 (thickness: 400 nm, for example). The element isolation regions 19 are formed by STI (Shallow Trench Isolation), for example.

FIGS. 14 and 15 show the cross sections of the field along the line B1–B2 and the line C1–C2 shown in FIG. 2, respectively. The active regions 11 and 13 and the element isolation region 19 are shown in these cross sections.

The first conductive layer located on the field is described below with reference to FIGS. 3, 11, 14, and 15. FIG. 3 is a plan view showing the first conductive layer. A plurality of the gate electrode layers 21a and 21b and a plurality of the sub-word lines 23 are disposed in the first conductive layer. The gate electrode layers 21a and 21b and the sub-word lines 23 have a structure in which a silicide layer is formed on a polysilicon layer, for example.

The gate electrode layers 21a and 21b respectively have a linear pattern extending in the Y-axial direction in FIG. 3. A pair of the gate electrode layers 21a and 21b is disposed in parallel in each memory cell region. The gate electrode layers 21a and 21b become the gate electrodes of the driver transistors $Q_3$ and $Q_4$ and the load transistors $Q_5$ and $Q_6$ shown in FIG. 1. The gate length of the driver transistors $Q_3$ and $Q_4$ is 0.18 μm, for example. The gate length of the load transistors $Q_5$ and $Q_6$ is 0.20 μm, for example.

The sub-word lines 23 have a linear pattern extending in the X-axial direction in FIG. 3. The sub-word lines 23 are located on the driver transistor side. The sub-word lines 23 are activated or deactivated by main-word lines located in the upper layer. The sub-word lines 23 become the gate electrodes of the transfer transistors. The gate length of the transfer transistors is 0.24 μm, for example.

FIGS. 14 and 15 show the cross sections of the first conductive layer along the line B1–B2 and the line C1–C2 shown in FIG. 3, respectively. The sub-word lines 23 and the gate electrode layer 21b are shown in these cross sections.

Source/drain regions and the like formed in the active regions are described below. $n^+$-type source/drain regions 11a are formed in the active regions 11, as shown in FIG. 11. The source/drain region is a region which functions as at least either the source or drain. An $n^+$-type well contact region 15a is formed in the active region 15. $p^+$-type well contact regions 17a are formed in the active regions 17.

An interlayer dielectric 65 (not shown in FIG. 11) such as a silicon oxide layer is formed to cover the field and the first conductive layer. The interlayer dielectric 65 is planarized using CMP, as shown in FIGS. 14 and 15. A plurality of contact holes 63 for exposing the $n^+$-type source/drain regions 11a and the like is formed in the interlayer dielectric 65. The contact holes 63 are filled with contact-conductive sections 61.

Each contact-conductive section 61 includes a plug 60 buried in the contact hole 63 and a refractory metal nitride layer 62 located on the bottom and the side of the contact hole 63. As a material for the plugs 60, tungsten and the like can be used. As a material for the refractory metal nitride layers 62, titanium nitride and the like can be used. The refractory metal nitride layers 62 mainly function as barrier layers. The diameter at the upper end of the contact holes 63 is 0.30 μm, for example. The diameter at the lower end of the contact holes 63 is 0.24 μm, for example.

Figure 4:
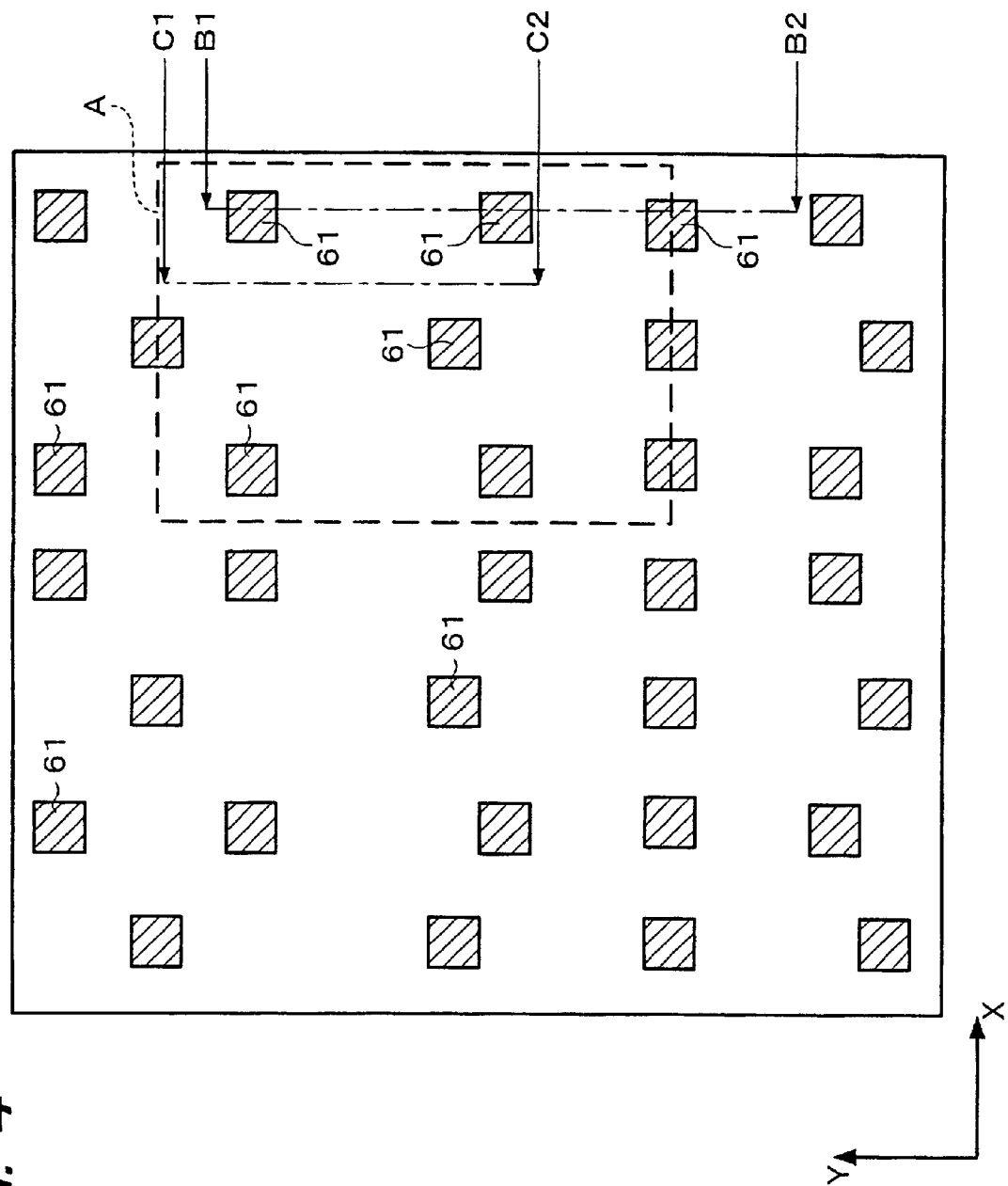
FIG. 4 is a plan view showing a contact-conductive section 61 in part of the memory cell array of the SRAM section according to the embodiment of the present invention.

FIG. 4 is a plan view showing the pattern of the contact-conductive sections 61. The contact-conductive sections 61 are connected to the $n^+$-type source/drain regions 11a, $p^+$-type source/drain regions 13a, $n^+$-type well contact regions 15a, and $p^+$-type well contact regions 17a, as shown in FIG. 11.

Second Conductive Layer

The second conductive layer is located on the structure shown in FIG. 11. A plurality of the drain-drain contact layers 31a and 31b, $V_{DD}$ line 33, a plurality of BL (bit line, bit line/) contact pad layers 35a and 35b, and a plurality of $V_{SS}$ local interconnects 37 are disposed in the second conductive layer, as shown in FIG. 5. For example, these layers and lines have a structure in which a refractory metal nitride layer (thickness: 135 nm, for example) is formed on a refractory metal layer (thickness: 8.5 nm, for example). The refractory metal layer, which is an underlay, is formed of a titanium layer, for example. The refractory metal nitride layer is formed of a titanium nitride layer, for example. The second conductive layer may be formed only of a refractory metal nitride layer. The $V_{SS}$ local interconnects 37 are used not only as local interconnects but also as contact pad layers.

The drain-drain contact layers 31a and 31b are described below. The drain-drain contact layers 31a and 31b respectively have a linear pattern extending in the Y-axial direction in FIG. 5. The width of a body section 31a3 of the drain-drain contact layers 31a is smaller than the width of end sections 31a1 and 31a2 of the drain-drain contact layers 31a. The width of a body section 31b3 of the drain-drain contact layers 31b is smaller than the width of end sections 31b1 and 31b2 of the drain-drain contact layers 31b. The width of the body sections 31a3 and 31b3 is a minimum design-rule width. A pair of the drain-drain contact layers 31a and 31b is disposed in each memory cell region.

Each $V_{SS}$ local interconnect 37 has end sections and a body section extending in the Y-axial direction in FIG. 5. The width of the end sections of the $V_{SS}$ local interconnects 37 is greater than the width of the body section of the $V_{SS}$ local interconnects 37. The $V_{SS}$ local interconnects 37 are located between the end section 31a2 of the drain-drain contact layer 31a and the end section 31b2 of the drain-drain contact layer 31b. The $V_{SS}$ local interconnects 37 extend from this location to between the end section 31a2 of the drain-drain contact layer 31a and the end section 31b2 of the drain-drain contact layer 31b in the memory cell located below in FIG. 5. One $V_{SS}$ local interconnect 37 is disposed in two memory cells.

The BL contact pad layers 35a function as pad layers for connecting the bit lines to the $n^+$-type source/drain regions 11a (see FIG. 11). The BL contact pad layers 35b function as pad layers for connecting the bit lines/to the $n^+$-type source/drain regions 11a.

The BL contact pad layers 35a are located between the drain-drain contact layer 31a of one memory cell and the drain-drain contact layer 31a of the memory cell located below in FIG. 5. The BL contact pad layers 35b are located between the drain-drain contact layer 31b of one memory cell and the drain-drain contact layer 31b of the memory cell located below in FIG. 5. Each of the BL contact pad layers 35a and 35b is disposed in every two memory cells.

The $V_{DD}$ line 33 has a linear pattern extending in the X-axial direction in FIG. 5. The $V_{DD}$ line 33 extends so as to three-dimensionally intersect the $n^+$-type well contact region 15a (see FIG. 11) The $V_{DD}$ line 33 has branched sections 33a and 33b above the $n^+$-type well contact region 15a.

The drain-drain contact layers 31a and 31b, the $V_{DD}$ line 33, the BL contact pad layers 35a and 35b, and the $V_{SS}$ local interconnects 37 which are disposed in the second conductive layer shown in FIG. 5 are connected to contact-conductive sections 61 shown in FIG. 11. The connection with the contact-conductive sections 61 is indicated by contact sections 61m in FIG. 5.

The cross section of the second conductive layer shown in FIG. 5 along the line B1–B2 is shown in FIG. 14. The drain-drain contact layer 31b and the BL contact pad layer 35b are shown in this cross section. The second conductive layer includes a refractory metal layer 30 and a refractory metal nitride layer 32 located on the refractory metal layer 30, as described above.

Figure 12:
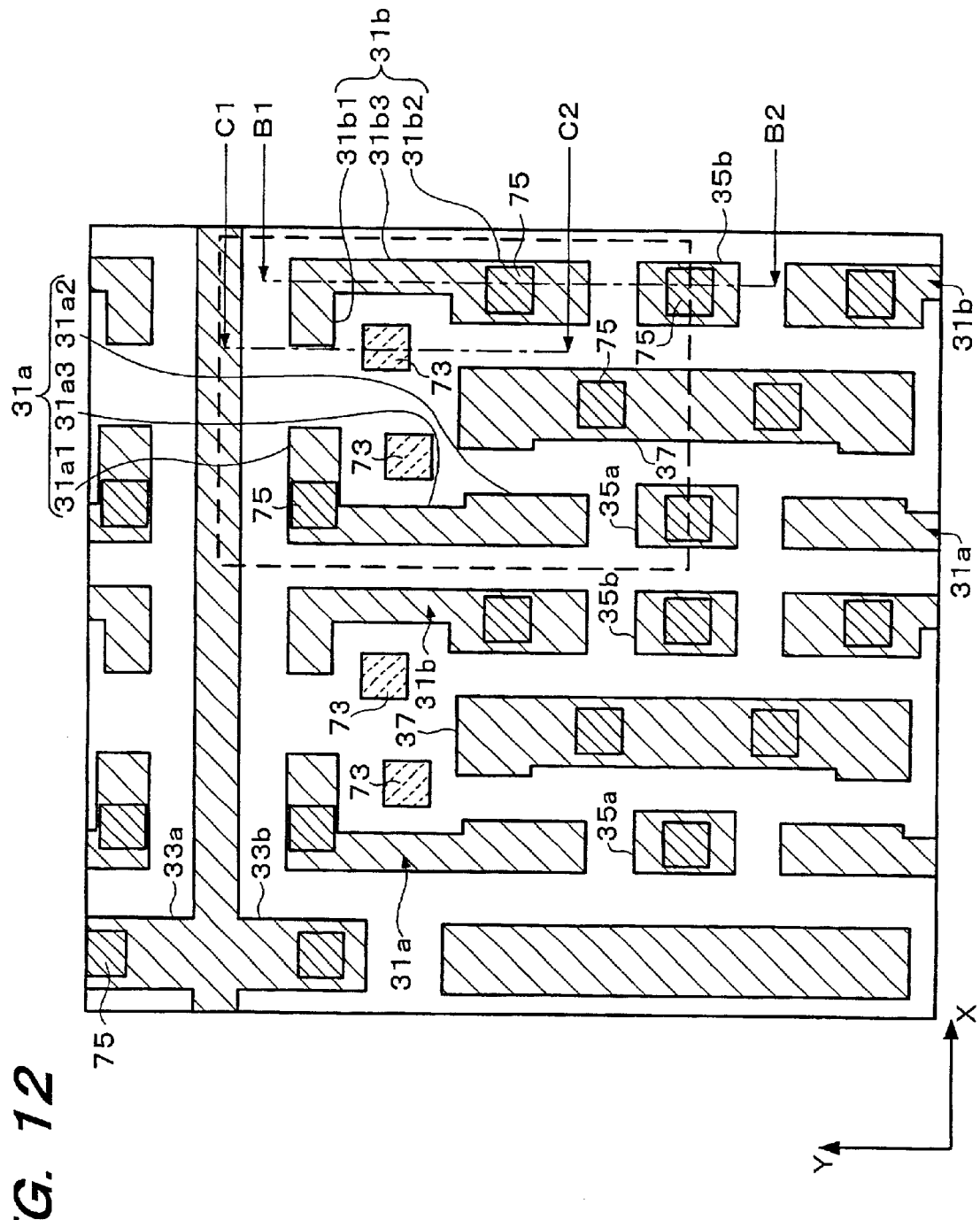
FIG. 12 is a plan view showing the second conductive layer, and the contact-conductive sections 73 and 75 in the SRAM section according to the embodiment of the present invention.

An interlayer dielectric 71 (not shown in FIG. 5) such as a silicon oxide layer is formed to cover the second conductive layer. The interlayer dielectric 71 is planarized using CMP, as shown in FIGS. 14 and 15. A plurality of through-holes 79 for exposing the drain-drain contact layers 31b and the like is formed in the interlayer dielectric 71. The through-holes 79 are filled with contact-conductive sections 75. A through-hole 77 for exposing the gate electrode layer 21b is formed in the interlayer dielectrics 71 and 65. The through-hole 77 is filled with contact-conductive section 73. FIG. 12 shows a planar relation between the contact-conductive sections 73 and 75 and the second conductive layer.

Figure 6:
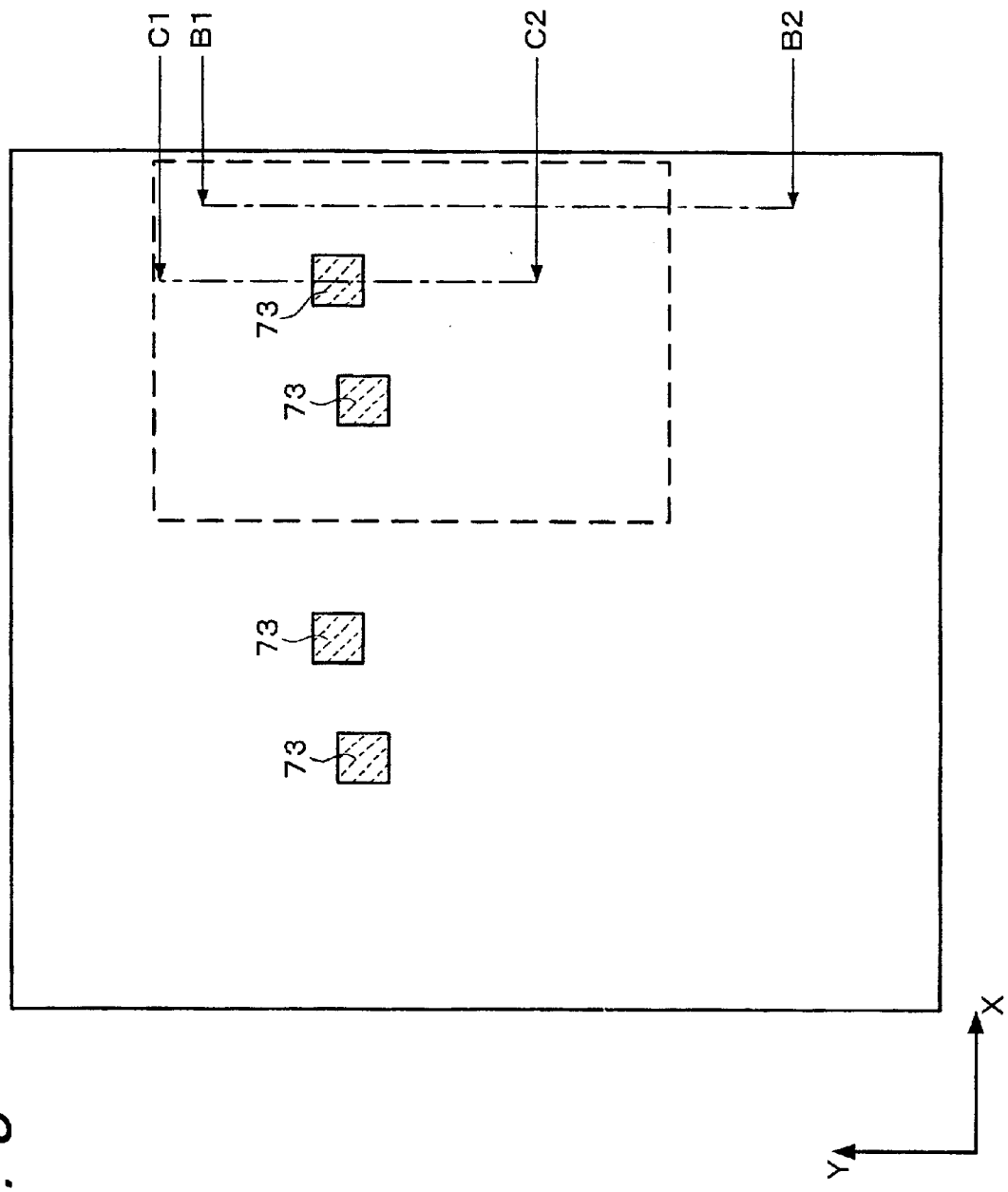
FIG. 6 is a plan view showing a contact-conductive section 73 in part of the memory cell array of the SRAM section according to the embodiment of the present invention.

The contact-conductive sections 73 are described below. FIG. 6 is a plan view showing the pattern of the contact-conductive sections 73. The contact-conductive sections 73 are connected to the gate electrode layers 21a and 21b (see FIG. 3). The cross section of the contact-conductive sections 73 is described below with reference to FIG. 15. The contact-conductive sections 73 are buried in the through-holes 77 formed through the interlayer dielectrics 65 and 71. In this cross section, the contact-conductive section 73 is connected to the gate electrode layer 21b. The contact-conductive section 73 includes a plug 70 buried in the through-hole 77 and a refractory metal nitride layer 72 located on the bottom and the side of the through-hole 77. As a material for the plug 70, tungsten and the like can be used. As a material for the refractory metal nitride layer 72, titanium nitride and the like can be used. The refractory metal nitride layer 72 mainly functions as a barrier layer. The diameter at the upper end of the through-hole 77 is 0.32 μm, for example. The diameter at the lower end of the through-hole 77 is 0.24 μm, for example.

Figure 7:
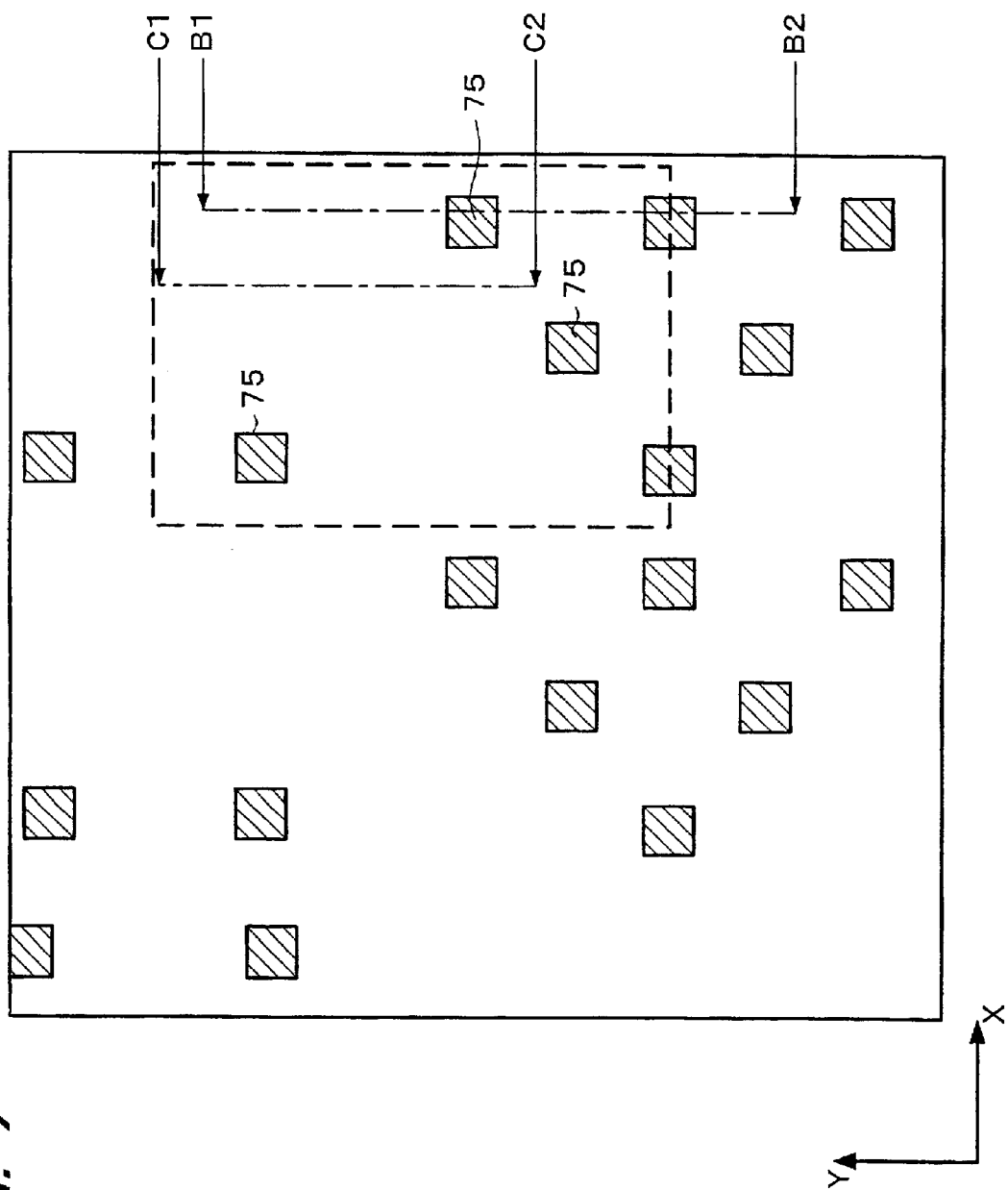
FIG. 7 is a plan view showing a contact-conductive section 75 in part of the memory cell array of the SRAM section according to the embodiment of the present invention.

The contact-conductive sections 75 are described below. FIG. 7 is a plan view showing the pattern of the contact-conductive sections 75. The contact-conductive sections 75 are connected to the end sections 31a1 of the drain-drain contact layers 31a, the end sections 31b2 of the drain-drain contact layers 31b, the branched sections 33a and 33b of the $V_{DD}$ line 33, the BL contact pad layers 35a and 35b, and the $V_{SS}$ local interconnects 37, as shown in FIG. 12. The cross section of the contact-conductive sections 75 is described with reference to FIG. 14. The contact-conductive sections 75 are buried in the through-holes 79 formed through the interlayer dielectric 71. In this cross section, the contact-conductive sections 75 are connected to the drain-drain contact layer 31b and the BL contact pad layer 35b. Components of the contact-conductive sections 75 are the same as those of the contact-conductive sections 61 and 73. The diameter at the upper end of the through-holes 79 is 0.30 μm, for example. The diameter at the lower end of the through-holes 79 is 0.24 μm, for example.

Third Conductive Layer

The third conductive layer is located on the structure shown in FIG. 12. A plurality of the drain-gate contact layers 41a and 41b, the main-word line 43, a plurality of BL contact pad layers 45a and 45b, a plurality of $V_{SS}$ contact pad layers 47, and a plurality of $V_{DD}$ contact pad layers 49 are disposed in the third conductive layer, as shown in FIG. 8.

Each drain-gate contact layer 41a includes a body section 41a3 and two end sections 41a1 and 41a2. The body section 41a3 extends in the X-axial direction in FIG. 8. The end section 41a1 is bent toward the drain-gate contact layer 41b. Each drain-gate contact layer 41b includes a body section 41b3 and two end sections 41b1 and 41b2. The body section 41b3 extends in the X-axial direction in FIG. 8. The end section 41b1 is bent toward the drain-gate contact layer 41a. A pair of the drain-drain contact layers 41a and 41b is disposed in each memory cell region.

The BL contact pad layers 45a function as pad layers for connecting the bit lines to the $n^+$-type source/drain regions 11a. The BL contact pad layers 45b function as pad layers for connecting the bit lines/to the $n^+$-type source/drain regions 11a. One BL contact pad layer 45a and one BL contact pad layer 45b are respectively disposed in two memory cells.

The $V_{SS}$ contact pad layers 47 extend in the Y-axial direction in FIG. 8 and have two end sections. The $V_{SS}$ contact pad layers 47 are located between the BL contact pad layer 45a and the BL contact pad layer 45b. One $V_{SS}$ contact pad layer 47 is disposed in two memory cells.

The main-word line 43 extends linearly in the X-axial direction in FIG. 8. The main-word line 43 is located above the $V_{DD}$ line 33 shown in FIG. 5. The $V_{DD}$ contact pad layers 49 are located above the branched sections 33a and 33b of the $V_{DD}$ line 33 shown in FIG. 5. In the present embodiment, the word line consists of the sub-word lines 23 (see FIG. 3) and the main-word line 43 (see FIG. 8). The main word line may not be formed.

Each of the end sections 41a1 of the drain-gate contact layers 41a and the end sections 41b1 of the drain-gate contact layers 41b are connected to the contact-conductive sections 73 shown in FIG. 12. These connections are indicated by contact sections 73m in FIG. 8. Each of the end sections 41a2 of the drain-gate contact layers 41a, the end sections 41b2 of the drain-gate contact layers 41b, the BL contact pad layers 45a and 45b, the $V_{SS}$ contact pad layers 47, and the $V_{DD}$ contact pad layers 49 are connected to the contact-conductive sections 75 shown in FIG. 12. These connections are indicated by contact sections 75m in FIG. 8.

FIGS. 14 and 15 show the cross sections of the third conductive layer along the line B1–B2 and the line C1–C2 shown in FIG. 8, respectively. The drain-gate contact layers 41a and 41b, the BL contact pad layer 45b, and the main-word line 43 are shown in these cross sections. The third conductive layer including these members has a structure in which a refractory metal nitride layer 42, a metal layer 44, a refractory metal layer 46, and a refractory metal nitride layer 48 are laminated in that order, for example. Specific examples of each layer are as follows. As an example of the refractory metal nitride layer 42, a titanium nitride layer can be given. As an example of the metal layer 44, an aluminum layer, a copper layer, and an alloy layer of these metals can be given. As an example of the refractory metal layer 46, a titanium layer can be given. As an example of the refractory metal nitride layer 48, a titanium nitride layer can be given.

Hard mask layers 40 formed of a silicon oxide layer are formed on the third conductive layer. The third conductive layer is patterned using the hard mask layers 40 as masks. This is because it is difficult to pattern the third conductive layer using only a resist as a mask due to miniaturization of memory cells.

Figure 9:
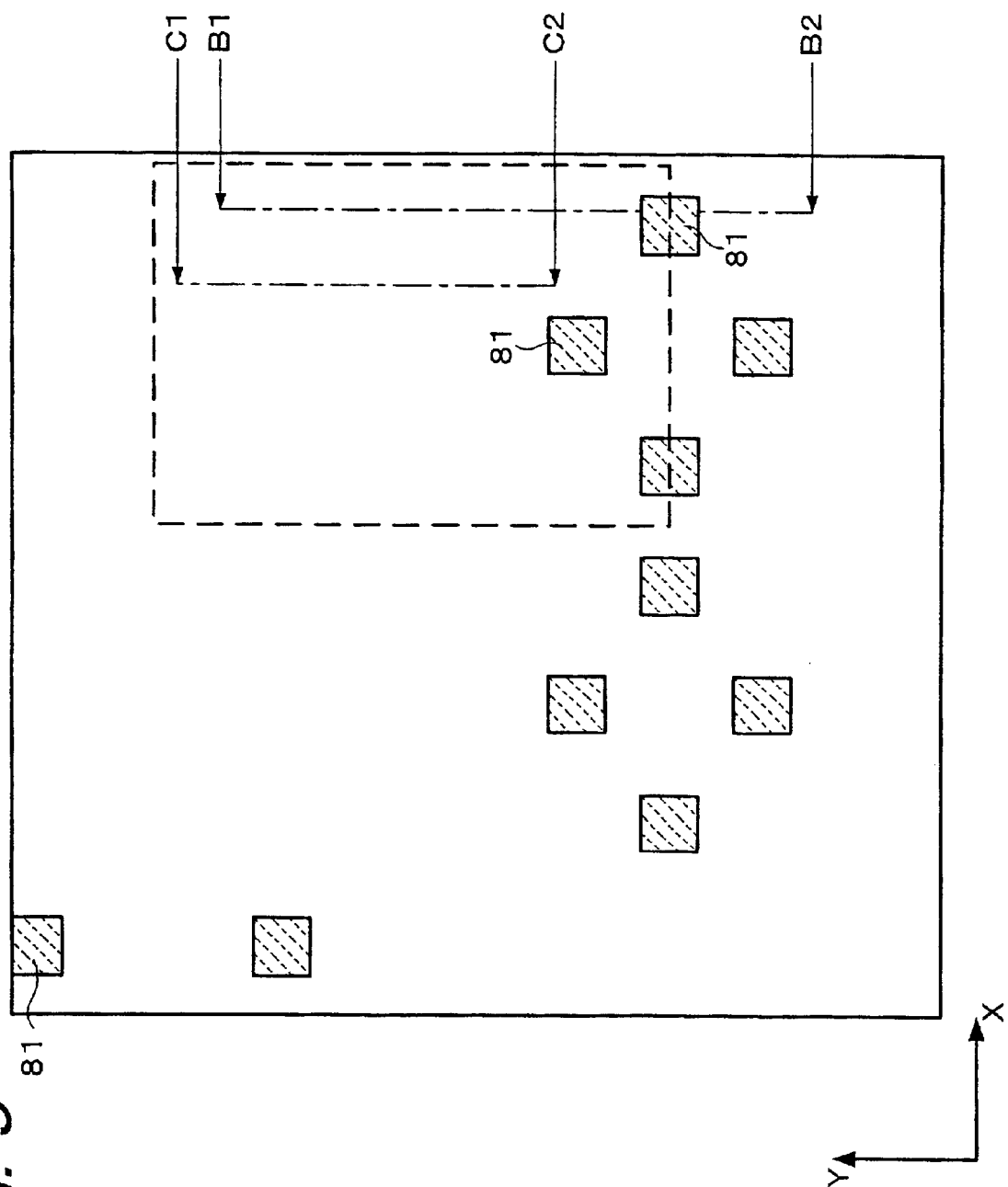
FIG. 9 is a plan view showing a contact-conductive section 81 in part of the memory cell array of the SRAM section according to the embodiment of the present invention.

An interlayer dielectric 85 such as a silicon oxide layer is formed to cover the third conductive layer. The interlayer dielectric 85 is planarized using CMP, as shown in FIGS. 14 and 15. Through-holes 83 for exposing the BL contact pad layers 45a and the like are formed in the interlayer dielectric 85. The through-holes 83 are filled with contact-conductive sections 81. FIG. 13 is a plan view showing this configuration. The contact-conductive sections 81 are connected to the BL contact pad layers 45a and 45b, the $V_{SS}$ contact pad layers 47, and the $V_{DD}$ contact pad layers 49, as shown in FIG. 13. FIG. 9 is a plan view showing the pattern of the contact-conductive sections 81. Components of the contact-conductive sections 81 are the same as those of the contact-conductive sections 61, 73, and 75. The diameter at the upper end of the through-holes 83 is 0.36 $\mu$m, for example. The diameter at the lower end of the through-holes 83 is 0.28 $\mu$m, for example.

Fourth Conductive Layer

The fourth conductive layer is located on the structure shown in FIG. 13. A plurality of bit lines 51, a plurality of bit lines/53, a plurality of $V_{SS}$ lines 55, and a $V_{DD}$ line 57 are disposed in the fourth conductive layer, as shown in FIG. 10. The $V_{SS}$ lines 55 are disposed between the bit lines 51 and the bit lines/53 at the center of the memory cells. One $V_{DD}$ line 57 is disposed in every 32 memory cells arrayed in the X-axial direction. These lines extend linearly in the Y-axial direction in FIG. 10. Each of these lines is connected to the contact-conductive sections 81 shown in FIG. 13. These connections are indicated by contact sections 81m in FIG. 10. The bit lines 51 and the like have a structure in which a titanium nitride layer, an aluminum-copper alloy layer, and a titanium nitride layer are laminated in that order, for example.

The cross section of the fourth conductive layer shown in FIG. 10 along the line B1–B2 is shown in FIG. 14. The bit line/53 is shown in this cross section. A signal which compensates a signal flowing through the bit lines 51 flows through the bit lines/53. The details of the structure of the present embodiment are described above.

The patterns shown in FIGS. 1 to 13 are design patterns. These patterns have corner sections. However, in a pattern actually formed on the semiconductor substrate, a line which specifies the corner sections is curved due to the proximity effect of light.

3. Structure of Logic Circuit Section 5

Figure 16:
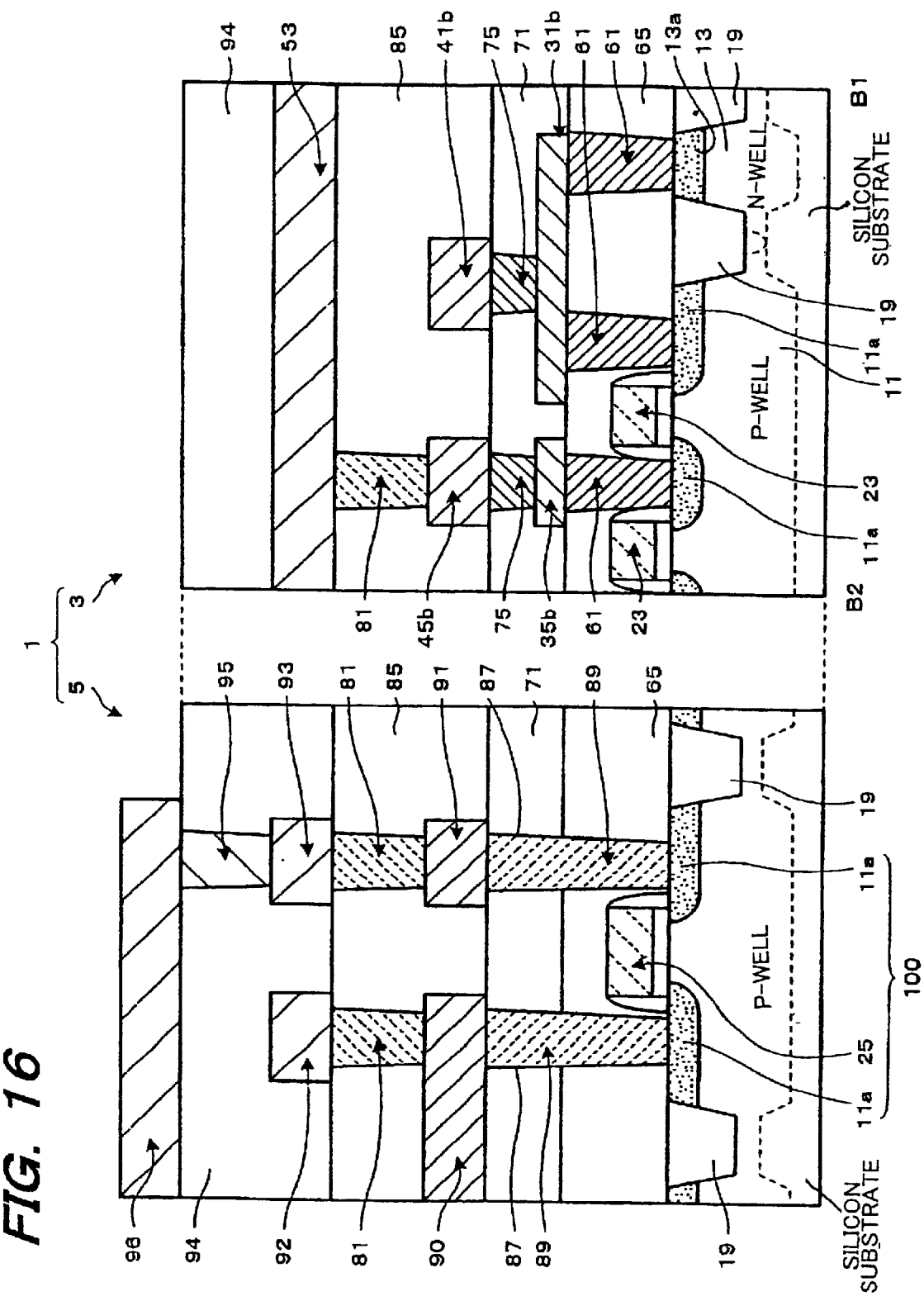
FIG. 16 is a cross-sectional view showing part of the SRAM section and part of a logic circuit section according to the embodiment of the present invention.

FIG. 16 is a cross-sectional view showing part of the SRAM section 3 and part of the logic circuit section 5. The cross section of this part of the SRAM section 3 corresponds to the cross section shown in FIG. 14. Note that the detailed structure is not illustrated in FIG. 16. The cross section of the SRAM section 3 is illustrated in order to describe the relation between each layer of the logic circuit section 5 and each layer of the SRAM section 3. Among the components of the logic circuit section 5, the same components as those of the SRAM section 3 are indicated by the same symbols.

The logic circuit section 5 and the SRAM section 3 are formed on a single silicon substrate. A MOS field effect transistor 100 is shown in the logic circuit section 5. Devices required for achieving the function of the logic circuit section 5 are formed in the logic circuit section 5. The MOS field effect transistor 100 includes a gate electrode 25 and a pair of the n$^+$-type source/drain regions 11a. The gate electrode 25 is formed in the same layer as the sub-word lines 23. Since the gate electrode 25 is formed simultaneously with the sub-word lines 23, components of the gate electrode 25 are the same as those of the sub-word lines 23. The interlayer dielectric 65 is formed to cover the gate electrode 25.

In the logic circuit section 5, a wiring layer is not formed on the interlayer dielectric 65. The interlayer dielectric 71 is formed on the interlayer dielectric 65. Two contact holes 87 are formed through the interlayer dielectric 65 and the interlayer dielectric 71. One of the contact holes 87 reaches one of the n$^+$-type source/drain regions 11a. The other contact hole 87 reaches the other n$^+$-type source/drain region 11a. The contact holes 87 are formed simultaneously with the through-holes 77 shown in FIG. 15. A contact hole which reaches the gate electrode 25 through the interlayer dielectric 65 and the interlayer dielectric 71 is also formed (not shown). This contact hole is formed simultaneously with the contact holes 87.

The diameter at the upper end of the contact holes 87 is 0.32 $\mu$m, for example. The diameter at the lower end of the contact holes 87 is 0.22 $\mu$m, for example. The depth of the contact holes 87 is 1.0 $\mu$m. The aspect ratio of the contact holes 87 (depth/lower end diameter) is approximately 4.5. The contact holes 87 are filled with contact-conductive sections 89. Since the contact-conductive sections 89 are formed simultaneously with the contact-conductive sections 73 shown in FIG. 15, components of the contact-conductive sections 89 are the same as those of the contact-conductive sections 73.

A first wiring layer 90 and a wiring contact pad 91 are formed on the interlayer dielectric 71. The wiring contact pad is a conductive layer for connecting the wiring layer to the n$^+$-type source/drain region 11a. The wiring contact pad 91 is connected to one of the contact-conductive sections 89. The first wiring layer 90 is connected to the other contact-conductive section 89. The first wiring layer 90 and the wiring contact pad 91 are located in the same layer as the drain-gate contact layer 41b and the BL contact pad layer 45b. The first wiring layer 90 and the wiring contact pad 91 are formed simultaneously with the drain-gate contact layer 41b and the BL contact pad layer 45b. Therefore, components of the first wiring layer 90 and the wiring contact pad 91 are the same as those of the drain-gate contact layer 41b and the BL contact pad layer 45b.

The interlayer dielectric 85 is formed to cover the first wiring layer 90 and the wiring contact pad 91. Two contact holes 81 are formed in the interlayer dielectric 85. One of the contact-conductive sections 81 is connected to the wiring contact pad 91. The other contact-conductive section 81 is connected to the first wiring layer 90.

A second wiring layer 92 and a wiring contact pad 93 are located on the interlayer dielectric 85. The wiring contact pad 93 is connected to one of the contact-conductive sections 81. The second wiring layer 92 is connected to the other contact-conductive section 81. The second wiring layer 92 and the wiring contact pad 93 are located in the same layer as the bit line/53. Since the second wiring layer 92 and the wiring contact pad 93 are formed simultaneously with the bit line/53, components of the second wiring layer 92 and the wiring contact pad 93 are the same as those of the bit line/53.

An interlayer dielectric 94 is formed to cover the second wiring layer 92, the wiring contact pad 93, and the bit line/53. Components of the interlayer dielectric 94 are the same as those of the interlayer dielectric 85. A contact-conductive section 95 is formed in the interlayer dielectric 94. The contact-conductive section 95 is connected to the wiring contact pad 93. Components of the contact-conductive section 95 are the same as those of other contact-conductive sections. A third wiring layer 96 is located on the interlayer dielectric 94. The third wiring layer 96 is connected to the contact-conductive section 95. Components of the third wiring layer 96 are the same as those of the second wiring layer 92.

The logic circuit section 5 may have a wiring structure in which the third wiring layer 96 and the contact-conductive section 95 are not formed. Alternatively, a fourth wiring layer and a fifth wiring layer may be formed in addition to the third wiring layer 96.

4. Major Effects of Present Embodiment

Major effects of the present embodiment are described below.

(1) According to the present embodiment, the memory cell size in the SRAM section can be reduced. In the present embodiment, information is stored using a flip-flop of the memory cell. A flip-flop is formed by connecting an input terminal (gate electrode) of a first inverter to an output terminal (drain) of a second inverter, and connecting an input terminal (gate electrode) of the second inverter to an output terminal (drain) of the first inverter. Specifically, the flip-flop is formed by cross-coupling the first inverter and the second inverter. In the case of forming a flip-flop using two layers, the inverters can be cross-coupled by forming each of a drain-drain contact layer for connecting the drains of the inverters and a drain-gate contact layer for connecting the gate and the drain of the inverters as one conductive layer.

According to this structure, these conductive layers are formed over regions including a region in which the drain of one inverter is located, a region in which the gate of the other inverter is located, and a region for connecting these regions. Therefore, the conductive layer has a pattern with three ends (for example, a pattern having a branched section in the shape of the letter "T" or "h"), or a spiral pattern in which the arms are intricate. For example, Japanese Patent Application Laid-open No. 10-41409 discloses a pattern in the shape of the letter "T" in FIG. 1. M. Ishida, et. al. IEDM Tech. IEDM Tech Digest (1998), page 203, FIG. 4(b) discloses a pattern in the shape of the letter "h", for example. M. Ishida, et. al. IEDM Tech. IEDM Tech Digest (1998), page 203, FIG. 3(b) discloses a spiral pattern, for example. These complicated patterns make it difficult to accurately reproduce the shape of a minute pattern in a photoetching process, whereby a desired pattern cannot be obtained. This hinders miniaturization of the memory cell size.

According to the present embodiment, the gate electrode layers (21a, 21b) which become the gates of the CMOS inverters, the drain-drain contact layers (31a, 31b) for connecting the drains of the CMOS inverters, and the drain-gate contact layers (41a, 41b) for connecting the gate of one CMOS inverter to the drain of the other CMOS inverter are respectively formed in different layers. Therefore, a flip-flop is formed using these three layers. Because of this, the pattern of each layer can be simplified (linearly, for example) in comparison with a case of forming a flip-flop using two layers. According to the present embodiment, since the pattern of each layer can be thus simplified, an SRAM of the 0.18 μm generation with a memory cell size of 4.5 μm² or less can be fabricated, for example.

(2) According to the present embodiment, the speed of the logic circuit section 5 can be increased. In the present embodiment, a refractory metal nitride layer (titanium nitride layer) is used in the drain-drain contact layers 31a and 31b, as shown in FIG. 16. A refractory metal nitride layer exhibits relatively high electric resistance. Therefore, when a refractory metal nitride layer is used as the wiring layer of the logic circuit section 5, the speed of the logic circuit section 5 cannot be increased. Generally, layers located at the same level are formed by the same step. When the logic circuit section 5 has a wiring layer at the same level as the drain-drain contact layers 31a and 31b, this wiring layer is inevitably formed of a refractory metal nitride layer. According to the present embodiment, the logic circuit section 5 does not have a wiring layer at the same level as the drain-drain contact layers 31a and 31b, whereby the speed of the logic circuit section 5 can be increased.

The contact-conductive sections 89 buried in the contact holes 87 are tungsten plugs, for example. In the SRAM section 3, the contact pad layer 35b formed of a refractory metal nitride layer is interposed between the contact-conductive section 61 and the contact-conductive section 75. Generally, a structure in which the contact pad layer is not interposed exhibits lower contact resistance in comparison with a structure in which the contact pad layer is interposed. This also increases the speed of the logic circuit section 5.

What is claimed:

1. A semiconductor device comprising a memory cell area and a semiconductor circuit section other than the memory cell section that are formed on the same semiconductor substrate, the memory cell section having a plurality of memory cells each of which includes a first driver transistor, a second driver transistor, a first load transistor, a second load transistor, a first transfer transistor, and a second transfer transistor, wherein:

each of the memory cells comprises a first gate electrode layer, a second gate electrode layer, a first drain-drain contact layer, a second drain-drain contact layer, a first drain-gate contact layer, and a second drain-gate contact layer;

the first gate electrode layer comprises a gate electrode of the first driver transistor and a gate electrode of the first load transistor;

the second gate electrode layer comprises a gate electrode of the second driver transistor and a gate electrode of the second load transistor;

the first drain-drain contact layer and the second drain-drain contact layer are located above the first gate electrode layer and the second gate electrode layer;

the first drain-drain contact layer is used to connect a drain region of the first driver transistor to a drain region of the first load transistor;

the second drain-drain contact layer is used to connect a drain region of the second driver transistor to a drain region of the second load transistor;

the first drain-gate contact layer is located above the first drain-drain contact layer and the second drain-drain contact layer;

the first drain-gate contact layer is used to connect the first drain-drain contact layer to the second gate electrode layer;

the second drain-gate contact layer is used to connect the second drain-drain contact layer to the first gate electrode layer; and the semiconductor circuit section has no wiring layer at the same level as the first drain-drain contact layer and the second drain-drain contact layer.

2. The semiconductor device according to claim 1, wherein a thickness of the first drain-drain contact layer and the second drain-drain contact layer is 100 nm to 170 nm.

3. The semiconductor device according to claim 1, wherein the first drain-drain contact layer and the second drain-drain contact layer comprise a refractory metal nitride layer.

4. The semiconductor device according to claim 1, further comprising a field effect transistor, a first interlayer dielectric, a second interlayer dielectric, a wiring layer, and a contact-conductive section, wherein:

the field effect transistor is located in the semiconductor circuit section;

the first interlayer dielectric is located in the memory cell section so as to cover the first gate electrode layer and the second gate electrode layer;

the first interlayer dielectric is located in the semiconductor circuit section so as to cover a gate electrode of the field effect transistor;

the second interlayer dielectric is formed in the memory cell section so as to cover the first drain-drain contact layer and the second drain-drain contact layer;

the second interlayer dielectric is located on the first interlayer dielectric in the semiconductor circuit section;

the wiring layer is located on the second interlayer dielectric in the semiconductor circuit section;

the wiring layer is located at the same level as the first drain-gate contact layer and the second drain-gate contact layer;

the contact-conductive section is located in a hole section formed through the first interlayer dielectric and the second interlayer dielectric in the semiconductor circuit section; and the contact-conductive section is used to connect the wiring layer to at least one of a source/drain of the field effect transistor and a gate electrode of the field effect transistor.

5. The semiconductor device according to claim 4, wherein an aspect ratio of the hole section is 5 or less.

6. The semiconductor device according to claim 1, wherein the semiconductor circuit section comprises a logic circuit section.

7. The semiconductor device according to claim 1, wherein the first gate electrode layer, the second gate electrode layer, the first drain-drain contact layer, and the second drain-drain contact layer respectively have a linear pattern and are disposed in parallel one another.

8. The semiconductor device according to claim 1, wherein:

the first driver transistor and the second driver transistor are n-type;

the first load transistor and the second load transistor are p-type;

the first transfer transistor and the second transfer transistor are n-type;

the memory cell section comprises a first conductive layer, a second conductive layer, a third conductive layer, and a fourth conductive layer;

the first gate electrode layer, the second gate electrode layer, and a sub-word line are located in the first conductive layer;

the first drain-drain contact layer, the second drain-drain contact layer, a power supply line, a first contact pad layer, a second contact pad layer, and a third contact pad layer are located in the second conductive layer;

the first drain-gate contact layer, the second drain-gate contact layer, a main-word line, a fourth contact pad layer, a fifth contact pad layer, and a sixth contact pad layer are located in the third conductive layer;

a first bit line, a second bit line, and a ground line are located in the fourth conductive layer;

the sub-word line extends in a first direction;

the power supply line is connected to a source region of the first load transistor and the second load transistor;

the first contact pad layer is used to connect the first bit line to a source/drain region of the first transfer transistor;

the second contact pad layer is used to connect the second bit line to a source/drain region of the second transfer transistor;

the third contact pad layer is used to connect a source region of the first driver transistor and the second driver transistor to the ground line;

the main-word line extends in the first direction;

the fourth contact pad layer is used to connect the first bit line to a source/drain region of the first transfer transistor;

the fifth contact pad layer is used to connect the second bit line to a source/drain region of the second transfer transistor;

the sixth contact pad layer is used to connect a source region of the first driver transistor and the second driver transistor to the ground line; and the first bit line and the second bit line extend in a second direction which intersects the first direction at right angles.

9. The semiconductor device according to claim 1, wherein a size of the memory cell is 4.5 $\mu m^2$ or less.

* * * * *